US012798042B2

(12) United States Patent
Yun et al.

(10) Patent No.: US 12,798,042 B2
(45) Date of Patent: Nov. 17, 2026

(54) POLISHING PAD AND METHOD FOR MANUFACTURING SEMICONDUCTOR DEVICE USING SAME

(71) Applicant: SK enpulse Co., Ltd., Gyeonggi-do (KR)

(72) Inventors: Sung Hoon Yun, Seoul (KR); Jae In Ahn, Gyeonggi-do (KR); Kyung Hwan Kim, Seoul (KR); Jang Won Seo, Seoul (KR)

(73) Assignee: ENPULSE CO., LTD., Chungcheongnam-do (KR)

( * ) Notice: Subject to any disclaimer, the term of this patent is extended or adjusted under 35 U.S.C. 154(b) by 722 days.

(21) Appl. No.: 17/874,989

(22) Filed: Jul. 27, 2022

(65) Prior Publication Data

US 2023/0052322 A1 Feb. 16, 2023

(30) Foreign Application Priority Data

Jul. 27, 2021 (KR) ........................ 10-2021-0098345

(51) Int. Cl.
*B24B 37/20* (2012.01)
*B24B 37/26* (2012.01)
*H10P 52/40* (2026.01)

(52) U.S. Cl.
CPC ............ *B24B 37/205* (2013.01); *B24B 37/26* (2013.01); *H10P 52/402* (2026.01)

(58) Field of Classification Search
CPC ....... B24B 37/205; B24B 37/26; B24B 37/22; B24B 37/20; H01L 21/30625; H01L 21/67092
See application file for complete search history.

(56) References Cited

U.S. PATENT DOCUMENTS 5,893,796 A * 4/1999 Birang .................. G01B 11/06 451/526
6,641,470 B1 * 11/2003 Zhao .................... B24B 37/205 451/6

(Continued)

FOREIGN PATENT DOCUMENTS

JP 2021013970 A 2/2021
KR 10-2003-0090697 A 11/2003

(Continued)

OTHER PUBLICATIONS

Office Action on the Taiwanese Patent Application No. 111128046 issued by the Taiwanese Patent Office on Sep. 27, 2023.

(Continued)

*Primary Examiner* — Monica S Carter
*Assistant Examiner* — Christopher Soto
(74) *Attorney, Agent, or Firm* — IP&T GROUP LLP

(57) ABSTRACT

The present disclosure is intended to provide, as a polishing pad to which a window for an endpoint detection is applied, and in which the window is capable of providing improved polishing performance in terms of preventing defects, etc., by a specific structure due to the window, rather than negatively affecting polishing performance as a local heterogeneous component on the polishing pad, a polishing pad including: a polishing layer including a first surface that is a polishing surface and a second surface that is a rear surface thereof, and containing a first through-hole penetrating from the first surface to the second surface; a window disposed in the first through-hole; and a void between a side surface of the first through-hole and a side surface of the window, and a method for manufacturing a semiconductor device by applying the same.

15 Claims, 6 Drawing Sheets

(56) References Cited

U.S. PATENT DOCUMENTS

| | | | | |
|---|---|---|---|---|
| 6,685,537 | B1 * | 2/2004 | Fruitman | B24B 37/205 451/6 |
| 9,868,185 | B2 * | 1/2018 | Lefevre | B24B 37/22 |
| 2004/0033758 | A1 * | 2/2004 | Wiswesser | B24B 37/205 451/6 |
| 2008/0125020 | A1 * | 5/2008 | Jiang | B24B 37/26 451/527 |
| 2017/0120417 | A1 | 5/2017 | Lefevre et al. | |
| 2019/0389033 | A1 * | 12/2019 | Yun | B24B 37/22 |
| 2020/0164483 | A1 * | 5/2020 | Yun | B24D 3/00 |

FOREIGN PATENT DOCUMENTS

| | | | |
|---|---|---|---|
| KR | 10-2018-0064550 | A | 6/2018 |
| KR | 10-2059647 | B1 | 12/2019 |
| TW | 201726315 | A | 8/2017 |

OTHER PUBLICATIONS

Office Action for Korean Patent Application No. 10-2021-0098345 issued by the Korean Patent Office on Mar. 7, 2023.

Office Action for Chinese Patent Application No. 202210879205.6 issued by the Chinese Patent Office on Jun. 21, 2025.

Office Action for Chinese Patent Application No. 202210879205.6 issued by the Chinese Patent Office on May 19, 2026.

* cited by examiner

POLISHING PAD AND METHOD FOR MANUFACTURING SEMICONDUCTOR DEVICE USING SAME

CROSS-REFERENCE TO RELATED APPLICATION(S)

This application claims priority to Korean Patent Application No. 10-2021-0098345, filed on Jul. 27, 2021, the disclosure of which is incorporated herein by reference in its entirety.

TECHNICAL FIELD

The present disclosure relates to a polishing pad applied to a chemical mechanical planarization process of a semiconductor substrate as a part of a semiconductor device manufacturing process, and a method for manufacturing a semiconductor device by applying the same.

DESCRIPTION OF THE RELATED ART

A chemical mechanical planarization (CMP) or chemical mechanical polishing (CMP) process is used for various purposes in various fields. The CMP process is performed on a predetermined polishing surface of a polishing target, and may be performed for the purposes of planarization of the polishing surface, removal of aggregated materials, resolution of crystal lattice damage, removal of scratches and contaminants, etc.

The CMP process technology of the semiconductor process may be classified depending on a polishing target film or the surface shape after polishing. For example, it may be divided into single silicon or polysilicon depending on the polishing target film, and may be classified into CMP processes of various oxide films divided depending on the type of impurities, or CMP processes of metal films such as tungsten (W), copper (Cu), aluminum (Al), ruthenium (Ru), tantalum (Ta), etc. In addition, depending on the surface shape after polishing, it may be classified into a process of alleviating the roughness of the substrate surface, a process of flattening a step difference caused by multilayer circuit wiring, and an element isolation process for selectively forming circuit wiring after polishing.

The CMP process may be applied in plurality in the process of manufacturing a semiconductor device. The semiconductor device includes a plurality of layers, and each layer contains a complex and fine circuit pattern. Further, in recent semiconductor devices, individual chip sizes are reduced, and the patterns of each layer are evolving in a direction of becoming more complex and finer. Accordingly, in the process of manufacturing the semiconductor device, the purpose of the CMP process has been expanded to not only the purpose of planarizing circuit wiring, but also the purpose of applying separation of circuit wiring and improvement of a wiring surface, and as a result, more sophisticated and reliable CMP performance is required.

A polishing pad used in such a CMP process is a process component that processes a polishing surface to a required level through friction, and may be viewed as one of the most important factors in the thickness uniformity of the polishing target after polishing, flatness of the polishing surface, and polishing quality.

SUMMARY

One embodiment is intended to provide, as a polishing pad to which a window for an endpoint detection is applied, a polishing pad that substantially provides a rather positive effect by minimizing the possibility that it may negatively affects polishing performance due to the fact that the window is applied as a local heterogeneous component in the polishing pad.

Another embodiment is intended to provide, as a method for manufacturing a semiconductor device by applying the polishing pad, a method capable of manufacturing a semiconductor device in which a specific structure of the polishing pad derived from the introduction of the window is combined with optimal process conditions related to the polishing process to secure excellent quality particularly in terms of preventing defects.

In one embodiment, there is provided a polishing pad including: a polishing layer including a first surface that is a polishing surface and a second surface that is a rear surface thereof, and containing a first through-hole penetrating from the first surface to the second surface; a window disposed in the first through-hole; and a void between a side surface of the first through-hole and a side surface of the window, wherein an opening of the void is contained between the first surface and an uppermost end surface of the window, and the opening of the void has a width of exceeding 0.00 μm.

The opening of the void may have a width of 50 μm to 500 μm.

The void has a volume gradient that increases or decreases in a direction from the first surface to the second surface, and an angle formed between the side surface of the first through-hole and the side surface of the window may be more than 0° and 60° or less.

When the void is a structure in which the volume increases in a direction from the first surface to the second surface, a ratio of the area of the lowermost end surface of the window to the area of the uppermost end surface of the window may be 0.950 or more and less than 1.000.

When the void is a structure in which the volume decreases in a direction from the first surface to the second surface, a ratio of the area of the lowermost end surface of the window to the area of the uppermost end surface of the window may be more than 1.000 and less than 1.050.

The first surface may include at least one groove, and the groove may have a depth of 100 μm to 1,500 μm and a width of 0.1 mm to 20 mm.

The first surface may include a plurality of grooves, the plurality of grooves may include concentric circular grooves, and a distance between adjacent two grooves of the concentric circular grooves may be 2 mm to 70 mm.

The polishing pad further includes a support layer which is disposed on the second surface side of the polishing layer and contains a second through-hole connected to the first through-hole, wherein the support layer includes a third surface of the polishing layer side and a fourth surface that is a rear surface thereof, the second through-hole is smaller than the first through-hole, and the window may be supported by the third surface.

In another embodiment, there is provided a polishing pad including: a polishing layer including a first surface that is a polishing surface and a second surface that is a rear surface thereof, and containing a first through-hole penetrating from the first surface to the second surface; and a window disposed in the first through-hole, wherein a void is contained between a side surface of the first through-hole and a side surface of the window, an opening of the void is contained between the first surface and an uppermost end surface of the window, and a value of Equation 1 below is more than 0.00 and 15.00 or less.

$$W\times(1-D) \quad \text{[Equation 1]}$$

In Equation 1, W is a width value (μm) of the opening of the void, and D is a volume ratio value of the window to the volume 1.00 of the first through-hole in the polishing layer.

In another embodiment, there is provided a method for manufacturing a semiconductor device, the method comprising steps of: providing a polishing pad including a polishing layer including a first surface that is a polishing surface and a second surface that is a rear surface thereof, containing a first through-hole penetrating from the first surface to the second surface, and including a window disposed in the first through-hole; and polishing the polishing target while rotating the polishing pad and the polishing target relative to each other under pressurized conditions after disposing the polishing target on the first surface so that a surface to be polished of a polishing target and the first surface are in contact with each other, wherein the polishing target includes a semiconductor substrate, the polishing pad includes a void between a side surface of the first through-hole and a side surface of the window, an opening of the void is contained between the first surface and an uppermost end surface of the window, and the opening of the void has a width of exceeding 0.00 μm.

The polishing pad according to one embodiment, as a polishing pad to which a window for an endpoint detection is applied, can rather provide improved polishing performance in terms of defect prevention and the like by minimizing the possibility that it may negatively affect polishing performance due to the fact that the window is applied as a local heterogeneous component in the polishing pad, and allowing the void derived from the window and the opening of the void to satisfy a specific structure.

The polishing pad according to another embodiment, as a polishing pad to which a window for an endpoint detection is applied, can rather provide improved polishing performance in terms of defect prevention and the like by minimizing the possibility that it may negatively affect polishing performance due to the fact that the window is applied as a local heterogeneous component in the polishing pad, and satisfying a specific correlation between the width of the opening of the void derived from the window and the volume of the window.

The method for manufacturing a semiconductor device according to another embodiment relates to a method for manufacturing a semiconductor device by applying the above-described polishing pad, and can provide a method for manufacturing a semiconductor device, which secures excellent quality in terms of defect prevention and the like by combining the above-described characteristics of the polishing pad with an optimal design of the process conditions during the manufacturing process of the semiconductor device.

DESCRIPTION OF SPECIFIC EMBODIMENTS

Figure 1:
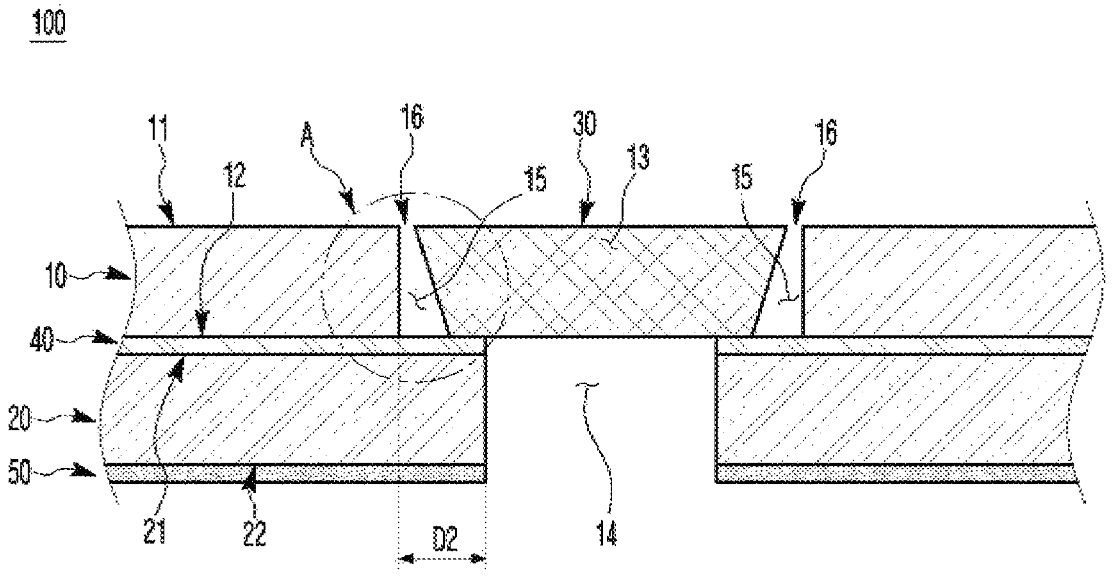
FIG. 1 schematically illustrates a cross section in the thickness direction of the polishing pad according to one embodiment.

Advantages and features of the present disclosure, and methods for achieving them will become apparent with reference to embodiments or examples to be described later. However, the present disclosure is not limited to the embodiments or examples disclosed below, but may be implemented in various different forms. The embodiments or examples specified below are intended to provide a complete disclosure of the present disclosure, and are only provided to inform those of ordinary skills in the art of the scope of the invention, and the right scope of the present disclosure is defined by the scope of the claims.

In the drawings, if necessary, the thickness of some components is enlarged in order to clearly express the layer or region. Further, in the drawings, the thickness of some layers and regions are exaggerated for convenience of description. The same reference numerals refer to the same elements throughout the specification.

Further, in the present specification, when a part of a layer, film, region, plate, etc. is said to be “above” or “on” other part, this is to be construed to not only include a case where the part is “directly above” the other part, but also include a case where another part is interposed in the middle therebetween. When a part is said to be “directly above” other part, this is interpreted to mean that another part is not interposed in the middle therebetween. Further, when a part of a layer, film, region, plate, etc. is said to be “under” or “below” other part, this is to be construed to not only include a case where the part is “directly under” the other part, but also include a case where another part is interposed in the middle therebetween. When a part is said to be “directly under” other part, this is interpreted to mean that another part is not interposed in the middle therebetween.

In the present specification, modifiers such as “first” or “second” are used to distinguish cases where their higher-order components are different, and only these modifiers do not mean that the mutual structures are specifically different types.

Hereinafter, embodiments according to the present disclosure will be described in detail.

In one embodiment of the present disclosure, there is provided a polishing pad including: a polishing layer including a first surface that is a polishing surface and a second surface that is a rear surface thereof, and containing a first through-hole penetrating from the first surface to the second surface; a window disposed in the first through-hole; and a void between a side surface of the first through-hole and a side surface of the window, wherein an opening of the void is contained between the first surface and an uppermost end surface of the window, and the opening of the void has a width of exceeding 0.00 μm.

The polishing pad is one of raw and subsidiary materials essential for a polishing process requiring surface planarization, etc., and in particular, is one of important process components in a semiconductor device manufacturing process. The purpose of the polishing pad is to promote the convenience of subsequent processing, such as planarizing an uneven structure and removing surface defects and the like. Although the polishing process is a process applied even to other technical fields other than the semiconductor technology field, the precision of the polishing process required in the semiconductor manufacturing process can be said to be the highest level when compared to other technical fields. Considering the recent tendency toward high integration and miniaturization of semiconductor devices, the overall quality of the semiconductor devices may be greatly deteriorated even by a very minute error in a polishing process during the process for manufacturing the semiconductor devices. Therefore, for fine control of the polishing process, a polishing endpoint detection technique has been introduced to stop polishing when the semiconductor substrate has precisely been polished to a desired degree. Specifically, an endpoint is determined by introducing a window having light transmittance to the polishing pad and sensing a change in film by an optical signal such as a laser. The window for detecting such an endpoint is a component made of a material and physical properties that are different from a basic material and physical properties constituting the polishing pad, and as this is introduced, a locally heterogeneous portion is created on the polishing surface of the polishing layer. Since polishing of the semiconductor substrate utilizes the polishing surface of the polishing pad as a whole, when the influence of the window portion on polishing of the semiconductor substrate is significantly different from that of other polishing surface portion, there is a concern that the overall polishing performance may be lowered.

From this point of view, the polishing pad according to one embodiment may obtain an effect that the local heterogeneity of the window rather contributes to the improvement of polishing performance by including a void between the side surface of the first through-hole and the side surface of the window, containing an opening of the void between the first surface and the uppermost end surface of the window, and including a specific window structure in which the opening has a width of more than 0.00 μm.

FIG. 1 schematically illustrates a cross section in the thickness direction of the polishing pad according to one embodiment. Referring to FIG. 1, the polishing pad 100 may include a polishing layer 10, and the polishing layer 10 may include a first surface 11 that is a polishing surface and a second surface 12 that is a rear surface thereof. The polishing layer 10 may contain a first through-hole 13 penetrating from the first surface 11 to the second surface 12. The polishing pad 100 may include a window 30 disposed in the first through-hole 13. Further, the polishing pad 100 includes a void 15 between a side surface of the first through-hole 13 and a side surface of the window 30. An opening 16 of the void may be contained between the first surface 11 and the uppermost end surface of the window 30, and the opening 16 may have a width of more than 0.00 μm.

The void 15 refers to an empty space between the side surface of the first through-hole 13 and the side surface of the window 30, the polishing pad 100 includes the void 15, and the opening 16 of the void is formed in an open structure with a width of more than 0.00 μm so that it may play a role of accommodating debris or the like that is a defect-occurrence element during polishing. A large amount of debris is generated in a polishing process during a semiconductor device manufacturing process. The debris includes pieces of the polishing layer removed by a conditioner or the like, remnants of the polishing slurry, and the like. When these debris remain on the polishing surface, they may cause damage to the surface of the semiconductor substrate and may cause defects such as scratches. Defects in the semiconductor substrate are a fatal cause of increasing the defect rate, and it is essential in terms of process efficiency to minimize them so that they do not occur substantially. The void 15 of the polishing pad 100 according to one embodiment may function as a trap for these debris, thereby performing a function of greatly improving the polishing performance by substantially preventing defects on the semiconductor substrate from occurring.

In the polishing pad according to one embodiment, the opening 16 of the void may be contained between the first surface 11 and the uppermost end surface of the window 30 in order to accommodate debris generated on the polishing surface into the void 15, and the opening 16 may have a width of about more than 0.00 μm, for example, about 50 μm to about 500 μm, for example, about 50 μm to about 450 μm, for example, about 50 μm to about 400 μm, for example, about 50 μm to 350 μm, for example, about 50 μm to about 300 μm, and for example, about 50 μm or more and about less than 300 μm. When the width of the opening is excessively large, there is a concern that even slurry components effectively functioning for polishing in addition to debris negatively affecting polishing may be confined in the void 15. Meanwhile, when the width of the opening is excessively small, since the debris that should be removed may not move into the void 15, there is a concern that the void 15 may not perform a desired function. That is, since the opening 16 of the void has a width within an appropriate range, it may be advantageous to effectively trap only the debris that should be a removal target, thereby effectively improving the polishing performance.

In one embodiment, the polishing pad 100 may have a value of Equation 1 below of about more than 0.00 and about 15.00 or less.

$$W\times(1-D) \qquad \text{[Equation 1]}$$

In Equation 1, W is a width value (μm) of the opening of the void, and D is a volume ratio value of the window to the volume 1.00 of the first through-hole in the polishing layer.

In Equation 1, W is a width value (μm) of the opening of the void, and D is a volume ratio value of the window to the volume 1.00 of the first through-hole in the polishing layer.

In Equation 1, W is a numerical value representing the width of the opening 16 of the void in unit of micrometers (μm), and D is a numerical value indicating the ratio of the volume of the window 30 to the volume 1.00 of the first through-hole 13 in the polishing layer 10. Equation 1 above is an equation value calculated using only each numerical value, and is expressed as a value without a unit.

In the calculation of D, the volume of the first through-hole 13 in the polishing layer 10 is calculated by multiplying the width, length, and height of the boundary corner of the first through-hole 13 and the polishing layer 10. The volume of the window 30 may be derived by a method of obtaining the volume of a truncated pyramid. More specifically, the volume of the window 30 may be derived by a method of obtaining the volume of a quadrangular truncated pyramid. That is, after measuring the width and length of a surface with a relatively wide area out of the upper and lower surfaces of the window 30, and measuring the width and length of a surface with a relatively narrow area, the thickness of the window 30 is measured to calculate an expected height of a pyramid having the surface with a relatively wide area out of the upper and lower surfaces of the window 30 as a bottom surface, and a volume (first volume) of the pyramid is derived. Subsequently, a volume of the window 30 may be calculated by calculating a volume (second volume) of a pyramid having the surface with a relatively narrow area out of the upper and lower surfaces of the window 30 as a bottom surface, and subtracting the volume (second volume) from the first volume.

The width W of the opening 16 of the void determines the size of debris flowing into the void 15 during polishing, and the ratio (D) of the volume of the window 30 to the volume of the first through-hole 13 determines the amount of a loadable debris in the void 15. Accordingly, although the void 15 is a locally heterogeneous structure on the polishing surface, Equation 1 above using W and D as constituent factors does not negatively affect the overall polishing performance, and rather has technical significance as an index indicating that it positively contributes to effects such as defect prevention and the like through loading of the debris.

Specifically, the value of Equation 1 above may be about more than 0.00 and about 15.00 or less, for example, about more than 0.00 and about 14.50 or less, for example, about more than 0.00 and about 14.00 or less, for example, about more than 0.00 and about 12.00 or less, for example, about more than about 0.00 and about 11.00 or less, for example, about more than 0.00 and about less than 11.00, for example, about 5.00 or more and about less than 11.00, for example, about 5.00 to about 10.00, and for example, about 5.00 to about 9.00.

The volume ratio value (D) of the window 30 to the volume 1.00 of the first through-hole 13 may be about 0.900 to about 0.999, for example, about 0.920 to about 0.999, for example, about 0.940 to about 0.999, for example, about 0.950 to about 0.980, and for example, about 0.960 to about 0.980. Since the volume ratio value D satisfies the above range, the amount of the debris loaded into the void 15 may be secured at an appropriate level.

Although the volume of the void 15 represented by the volume ratio value D of the window 30 to the volume 1.00 of the first through-hole 13 is sufficiently large, if the width value D of the opening 16 is excessively small, inflow itself of the debris may be difficult. Although the width value D of the opening 16 is sufficiently large, if the volume of the void 15 is excessively small, loading itself of the debris may be difficult. That is, Equation 1 above using W and D as constituent factors is one which represents their organic interrelationship as a numerical value within an appropriate range, and it may be seen that meaning of the technical index is great.

Specifically, the loading amount in the void 15 may be about more than 0.1 mg and about 1.00 mg or less, for example, about more than 0.1 mg and about less than 0.9 mg, for example, about 0.3 mg to about 0.9 mg, for example, about 0.5 mg to about 0.8 mg, and for example, about more than 0.5 mg and about 0.8 mg or less. If the amount of loading in the void 15 is excessively small, the function of loading the debris of the void 15 is not implemented to the desired level, and thus there is a concern that the debris remaining on the polishing surface may cause the occurrence of defects. If the amount of loading in the void 15 is excessively large, loaded debris is discharged back onto the polishing surface so that it may cause the occurrence of defects, or slurry components that should effectively function for polishing are contained in the debris so that there may be a concern that polishing performance is reduced. In one embodiment, the amount of loading in the void may be derived by polishing a substrate having a silicon oxide film as a surface to be polished using the polishing pad 100, performing polishing for 1 hour while performing conditioning under pressurized conditions of a 3 lb load using a conditioner (CI45, Saesol Diamond), disassembling the window portion to wash the debris loaded in the void with DI-water and store it, and then vaporizing all the liquid, thereby measuring the weight of the remaining solid materials.

Figure 2:
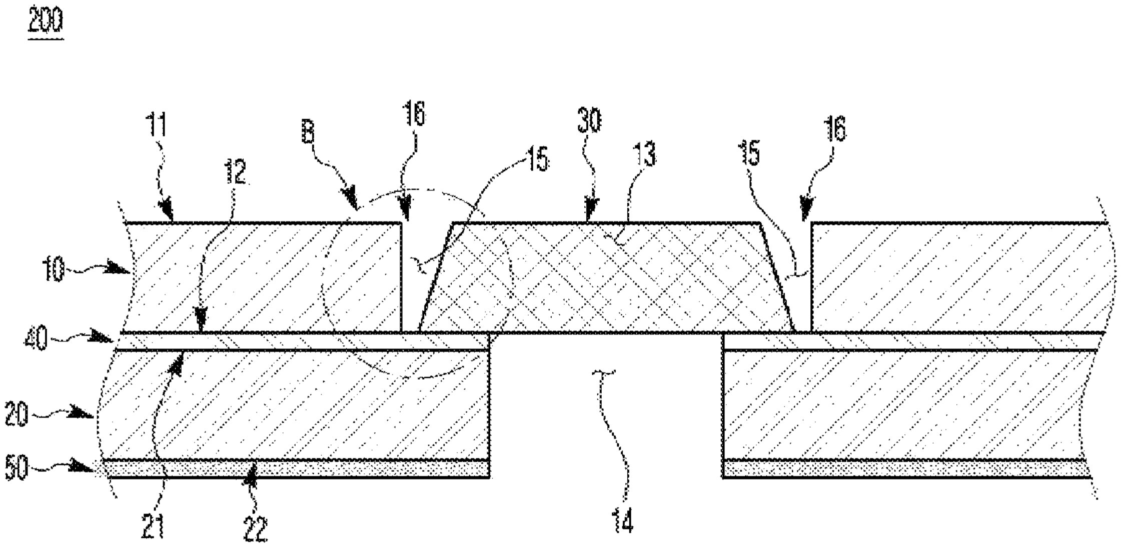
FIG. 2 schematically illustrates a cross section in the thickness direction of the polishing pad according to other embodiments.
Figure 3:
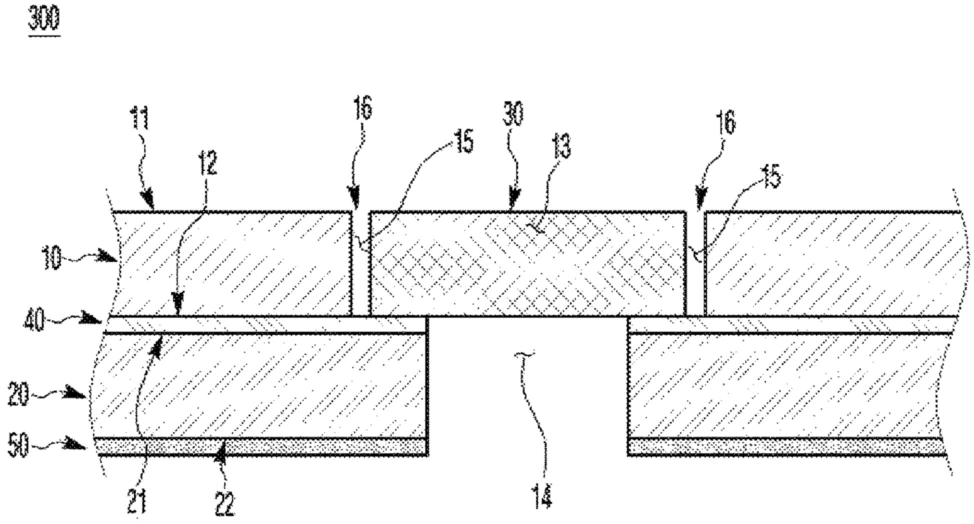
FIG. 3 schematically illustrates a cross section in the thickness direction of the polishing pad according to another embodiment.

FIGS. 2 and 3 schematically illustrate cross sections in the thickness direction of the polishing pads 200 and 300 according to different embodiments respectively.

Referring to FIGS. 1 and 2, the void 15 may have a volume gradient that increases or decreases in a direction from the first surface 11 to the second surface 12. FIG. 1 shows an example in which the volume of the void 15 increases in a direction from the first surface 11 to the second surface 12, and FIG. 2 shows an example in which the volume of the void 15 decreases in a direction from the first surface 11 to the second surface 12. As another example, referring to FIG. 3, the volume of the void 15 may be constant without a gradient in a direction from the first surface 11 to the second surface 12.

Figure 4:
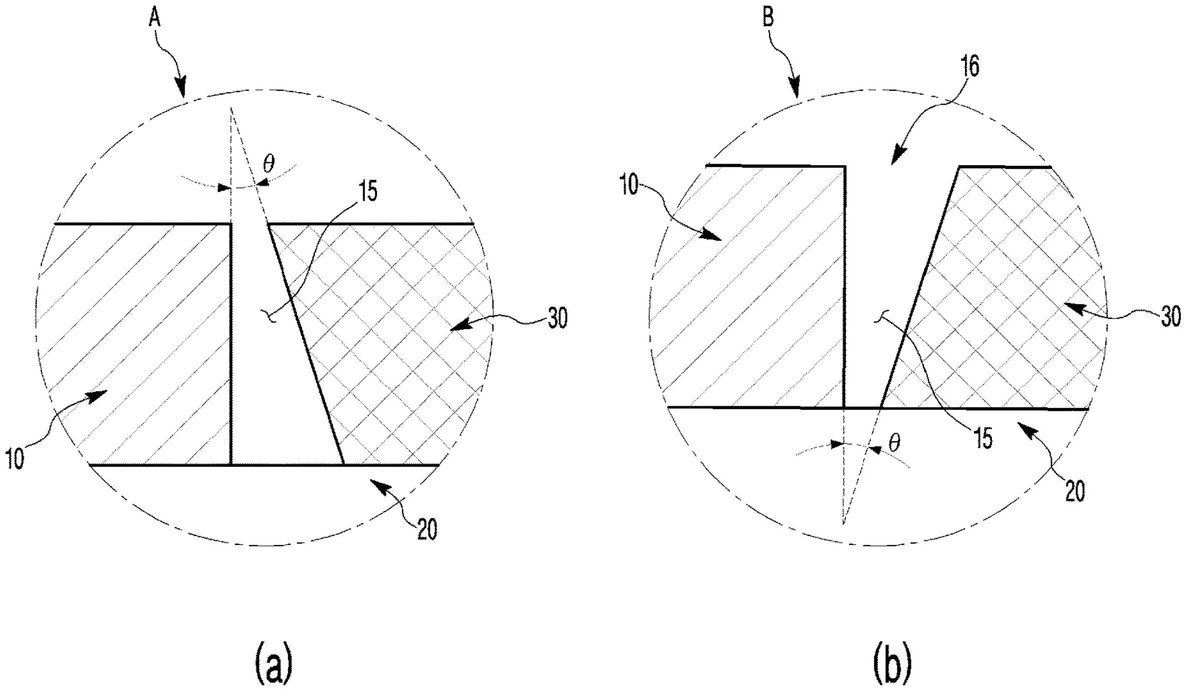
FIG. 4(*a*) illustrates an enlarged view of part A of FIG. 1, and FIG. 4(*b*) illustrates an enlarged view of part B of FIG. 2.

FIG. 4(*a*) illustrates an enlarged view of part A of FIG. 1; and FIG. 4(*b*) illustrates an enlarged view of part B of FIG. 2. Referring to FIG. 4(*a*) and FIG. 4(*b*), in one embodiment, the void 15 has a volume gradient that increases or decreases in a direction from the first surface 11 to the second surface 12, and the angle formed between the side surface of the first through-hole 13 and the side surface of the window 30 may have a size 0 of about more than 0° and about 60° or less.

For example, the angle formed between the side surface of the first through-hole 13 and the side surface of the window 30 may have a size e of about more than 0° and about 60° or less, about more than 0° and about 30° or less, for example, about more than 0° and about 20° or less, for example, about 1° to about 20°, and for example, about 1° to about 15°.

When the void 15 has a volume gradient that increases or decreases in a direction from the first surface 11 to the second surface 12, the debris loading efficiency may be improved within the same time compared to the case where there is no gradient. As shown in FIG. 1, for example, when the volume of the void 15 increases in the direction from the first surface 11 to the second surface 12, it may be advantageous to stagnate the debris loaded in the void 15 so that it does not escape again, and it may be more advantageous when applied to a polishing process with a high degree of generation of debris at the beginning of the process or throughout the process. As shown in FIG. 2, for example, when the volume of the void 15 decreases in the direction from the first surface 11 to the second surface 12, since the opening 16 of the void becomes relatively large, it may be advantageous to load a relatively large debris in the void 15 using the gradient, and it may be more advantageous when applied to a polishing process in which a relatively large debris is generated depending on conditioner operating conditions or the like.

In one embodiment, when the void 15 is a structure in which the volume increases in the direction from the first surface 11 to the second surface 12, the ratio of the area of the lowermost end surface of the window 30 to the area 1.000 of the uppermost end surface of the window 30 may be about 0.950 or more and about less than 1.000. In another embodiment, when the void 15 is a structure in which the volume decreases in the direction from the first surface 11 to the second surface 12, the ratio of the area of the lowermost end surface of the window 30 to the area 1.000 of the uppermost end surface of the window 30 may be about more than 1.000 and about 1.050 or less. The ratio of the area of the lowermost end surface of the window 30 to the area 1.000 of the uppermost end surface of the window 30 satisfies a range of about 0.950 or more and about 1.050 or less so that it may be advantageous to maximize the debris loading efficiency by maximally securing the area in which the endpoint detection function of the window 30 is performed, and utilizing the volume gradient of the void 15 at the same time.

In one embodiment, the Shore D hardness of the first surface 11 of the polishing layer 10 may be less than or equal to the Shore D hardness of the uppermost end surface of the window 30. For example, the Shore D hardness of the first surface 11 of the polishing layer 10 may be less than the Shore D hardness of the uppermost end surface of the window 30. For example, a difference between the Shore D hardness of the first surface 11 of the polishing layer and the Shore D hardness of the uppermost end surface of the window 30 may be about 0 to about 20, for example, about more than 0 and about 20 or less, for example, about 1 to about 20, for example, about 1 to about 15, for example, about 5 to about 15, and for example, about 5 to about 10. Here, the Shore D hardness is a value measured in a room temperature dry state. The 'room temperature dry state' means a state without a wet treatment to be described later at one temperature in the range of about 20° C. to about 30° C. Since the opening 16 of the void is a structure positioned at the boundary between the first surface 11 and the uppermost end surface of the window 30, and has an open structure that is about more than 0.00 μm, if the surface properties of the first surface 11 and the uppermost end surface of the window 30 do not have an appropriate correlation, there is a concern of causing defects such as scratches on a semiconductor substrate or the like that is a polishing target due to a gap therebetween. From this point of view, the Shore D hardness difference between the first surface 11 and the uppermost end surface of the window 30 satisfies the above range so that the gap by the opening 16 of the void may not negatively affect the surface of the semiconductor substrate that is being polished while repeatedly moving to the first surface 11 and the uppermost end surface of the window 30.

In one embodiment, the Shore D hardness of the uppermost end surface of the window 30 may be about 50 to about 75, for example, about 55 to about 70.

In one embodiment, the Shore D wet hardness measured at 30° C. of the first surface 11 of the polishing layer 10 may be less than the Shore D wet hardness measured at 30° C. of the uppermost end surface of the window 30. In this case, the Shore D wet hardness is a surface hardness value measured after immersion in water at the corresponding temperature for 30 minutes. For example, the difference between the Shore D wet hardness values measured at 30° C. of the first surface 11 of the polishing layer and the uppermost end surface of the window 30 may be about more than 0 and about 15 or less, for example, about 1 to about 15, and for example, about 2 to about 15.

In one embodiment, the Shore D wet hardness measured at 50° C. of the first surface 11 of the polishing layer may be less than the Shore D wet hardness measured at 50° C. of the uppermost end surface of the window 30. In this case, the Shore D wet hardness is a surface hardness value measured after immersion in water at the corresponding temperature for 30 minutes. For example, the difference between the Shore D wet hardness values measured at 50° C. of the first surface 11 of the polishing layer and the uppermost end surface of the window 30 may be about more than 0 and about 15 or less, for example, about 1 to about 25, for example, about 5 to about 25, and for example, about 5 to about 15.

In one embodiment, the Shore D wet hardness measured at 70° C. of the first surface 11 of the polishing layer may be less than the Shore D wet hardness measured at 70° C. of the uppermost end surface of the window 30. In this case, the Shore D wet hardness is a surface hardness value measured after immersion in water at the corresponding temperature for 30 minutes. For example, the difference between the Shore D wet hardness values measured at 70° C. of the first surface 11 of the polishing layer and the uppermost end surface of the window 30 may be about more than 0 and about 15 or less, for example, about 1 to about 25, for example, about 5 to about 25, and for example, about 8 to about 16.

The polishing process to which the polishing pad is applied is a process in which it is polished while a liquid slurry is being applied mainly onto the first surface 11. Further, the temperature of the polishing process may vary mainly in a range of about 30° C. to about 70° C. That is, the difference between hardness values of the first surface 11 and the uppermost end surface of the window 30 derived based on the Shore D hardness values measured under a temperature condition and a wet environment similar to the actual process satisfies the above-described range so that the gap by the opening 16 of the void may not negatively affect the surface of the semiconductor substrate that is being polished while repeatedly moving to the first surface 11 and the uppermost end surface of the window 30. As a result, it may secure the debris loading effect by the void 15 and excellently implement basic polishing performance such as polishing rate and polishing flatness at the same time.

In one embodiment, the window 30 may include a non-foamed cured product of a window composition comprising a first urethane-based prepolymer. Since the window 30 includes a non-foamed cured product, it may be more advantageous to secure light transmittance and appropriate surface hardness required for detecting an endpoint compared to a case where the window 30 includes a foamed cured product. The 'prepolymer' refers to a polymer having a relatively low molecular weight in which the polymerization degree is stopped at an intermediate stage to facilitate molding in the production of a cured product. The prepolymer itself may be subjected to an additional curing process such as heating and/or pressurization, or mixed and reacted with other polymerizable compound, for example, an additional compound such as a heterogeneous monomer or a heterogeneous prepolymer, and then molded into a final cured product.

The first urethane-based prepolymer may be prepared by reacting a first isocyanate compound and a first polyol compound. The first isocyanate compound may include one selected from the group consisting of an aromatic diisocyanate, an aliphatic diisocyanate, an alicyclic diisocyanate, and combinations thereof. In one embodiment, the first isocyanate compound may include an aromatic diisocyanate and an alicyclic diisocyanate.

The first isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, hexamethylenediisocyanate, dicyclohexylmethanediisocyanate, 4,4'-dicyclohexylmethanediisocyanate ($H_{12}MDI$), isophorone diisocyanate, and combinations thereof.

The first polyol compound may include, for example, one selected from the group consisting of a polyether polyol, a polyester polyol, a polycarbonate polyol, an acrylic polyol, and combinations thereof. The ‘polyol’ refers to a compound containing at least two hydroxyl groups (—OH) per molecule. In one embodiment, the first polyol compound may include a dihydric alcohol compound having two hydroxyl groups, that is, a diol or a glycol. In one embodiment, the first polyol compound may include a polyether polyol.

The first polyol compound may include, for example, one selected from the group consisting of polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol (PPG), and combinations thereof.

In one embodiment, the first polyol compound may have a weight average molecular weight (Mw) of about 100 g/mol to about 3,000 g/mol, for example, about 100 g/mol to about 2,000 g/mol, for example, about 100 g/mol to about 1,800 g/mol, for example, about 500 g/mol to about 1,500 g/mol, and for example, about 800 g/mol to about 1,200 g/mol.

In one embodiment, the first polyol compound may include a low molecular weight polyol having a weight average molecular weight (Mw) of about 100 g/mol or more and about less than 300 g/mol, and a high molecular weight polyol having a weight average molecular weight (Mw) of about 300 g/mol or more and about 1,800 g/mol or less. The low molecular weight polyol and the high molecular weight polyol having the above-mentioned weight average molecular weight ranges are appropriately mixed and used as the first polyol compound so that a non-foamed cured product having an appropriate crosslinking structure may be formed from the first urethane-based prepolymer, and the window 30 may be more advantageous in securing desired physical properties such as hardness and optical properties such as light transmittance.

The first urethane-based prepolymer may have a weight average molecular weight (Mw) of about 500 g/mol to about 2,000 g/mol, for example, about 800 g/mol to about 1,500 g/mol, and for example, about 900 g/mol to about 1,200 g/mol. Since the first urethane-based prepolymer has a degree of polymerization corresponding to the above-mentioned weight average molecular weight (Mw) range, the window composition is cured without foaming under predetermined process conditions, and thus it may be more advantageous for forming the window 30 having an appropriate surface hardness correlation with the polishing surface of the polishing layer 10 in relation to the structure of the void 15.

In one embodiment, the first isocyanate compound may include an aromatic diisocyanate and an alicyclic diisocyanate. The aromatic diisocyanate may include, for example, 2,4-toluene diisocyanate (2,4-TDI) and 2,6-toluene diisocyanate (2,6-TDI), and the alicyclic diisocyanate may include dicyclohexylmethanediisocyanate ($H_{12}MDI$). Further, the first polyol compound may include, for example, polytetramethylene ether glycol (PTMG), diethylene glycol (DEG), and polypropylene glycol (PPG).

In the window composition, the total amount of the first polyol compound based on 100 parts by weight of the total amount of the first isocyanate compound in the total components for preparing the first urethane-based prepolymer may be about 100 parts by weight to about 250 parts by weight, for example, about 120 parts by weight to about 250 parts by weight, for example, about 120 parts by weight to about 240 parts by weight, for example, about 150 parts by weight to about 240 parts by weight, and for example, about 150 parts by weight to about 200 parts by weight.

In the window composition, the first isocyanate compound may include the aromatic diisocyanate, the aromatic diisocyanate may include 2,4-TDI and 2,6-TDI, and the content of 2,6-TDI may be about 1 part by weight to about 40 parts by weight, for example, about 1 part by weight to about 30 parts by weight, for example, about 10 parts by weight to about 30 parts by weight parts, and for example, about 15 parts by weight to about 30 parts by weight based on 100 parts by weight of 2,4-TDI.

In the window composition, the first isocyanate compound may include the aromatic diisocyanate and the alicyclic diisocyanate, and the total content of the alicyclic diisocyanate may be about 5 parts by weight to about 30 parts by weight, for example, about 10 parts by weight to about 30 parts by weight, and for example, about 15 parts by weight to about 30 parts by weight based on 100 parts by weight of the total content of the aromatic diisocyanate.

When the relative content ratios of the respective components of the window composition satisfy the above-mentioned ranges individually or at the same time, while the window 30 manufactured from the window composition secures light transmittance required for the endpoint detection function, the uppermost end surface of the window 30 may have an appropriate surface hardness at the same time. Accordingly, the uppermost end surface of the window 30 may form an appropriate surface hardness correlation with the polishing surface of the polishing layer 10 prepared from the polishing layer composition in which the relative content ratios of the respective components satisfy those to be described later individually or at the same time, and it ensures that the gap by the opening 16 of the void does not substantially negatively affect the realization of the desired polishing performance so that it may be more advantageous for the void 15 to excellently perform the debris-loading function.

The window composition may have an isocyanate group content (NCO %) of about 7% by weight to about 10% by weight, for example, about 7.5% by weight to about 9.5% by weight, and for example, about 8% by weight to about 9% by weight. The isocyanate group content means a percentage by weight of an isocyanate group (—NCO) present as a free reactive group without being subjected to a urethane reaction in the total weight of the window composition. The isocyanate group content may be designed by comprehensively controlling the type and content of the first isocyanate compound and the first polyol compound for preparing the first urethane-based prepolymer, the conditions of temperature, pressure, time, etc. of the process for preparing the first urethane-based prepolymer, and the type and content of additives used in the preparation of the first urethane-based prepolymer. When the isocyanate group content of the window composition satisfies the above range, the window composition may be cured without foaming to secure an appropriate surface hardness, and it may be advantageous to secure an appropriate hardness correlation with the polishing layer in relation to the void structure and the debris loading effect thereof.

The window composition may further comprise a curing agent. The curing agent is a compound for chemically reacting with the first urethane-based prepolymer to form a final cured structure in the window, and may include, for example, an amine compound or an alcohol compound. Specifically, the curing agent may include one selected from the group consisting of aromatic amines, aliphatic amines, aromatic alcohols, aliphatic alcohols, and combinations thereof.

The curing agent may include, for example, one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylylenediamine, isophorone diamine, ethylenediamine, diethylenetriamine, triethylenetetramine, polypropylenediamine, polypropylenetriamine, bis(4-amino-3-chlorophenyl) methane, and combinations thereof.

The curing agent may be contained in an amount of about 18 parts by weight to about 28 parts by weight, for example, about 19 parts by weight to about 27 parts by weight, and for example, about 20 parts by weight to about 26 parts by weight, based on 100 parts by weight of the window composition.

In one embodiment, the curing agent may include an amine compound, and the molar ratio of the isocyanate group (—NCO) in the window composition to the amine group (—$NH_2$) in the curing agent may be about 1:0.60 to about 1:1 and, for example, about 1:0.70 to about 1:0.90.

As described above, the window may include a non-foamed cured product of the window composition. Accordingly, the window composition may not comprise a foaming agent. Light transmittance required for endpoint detection may be secured by passing the window composition through the curing process without a foaming agent.

The window composition may further comprise an additive as needed. The type of the additive may include one selected from the group consisting of a surfactant, a pH adjuster, a binder, an antioxidant, a heat stabilizer, a dispersion stabilizer, and combinations thereof. The names such as 'surfactant' and 'antioxidant' are arbitrary names based on the main role of the corresponding material, and each corresponding material does not necessarily perform only a function limited to the role by the corresponding name.

In one embodiment, the window 30 may have a light transmittance for light having one wavelength within a wavelength range of about 500 nm to about 700 nm with respect to a thickness of about 2 mm of about 1% to about 50%, for example, about 30% to about 85%, for example, about 30% to about 70%, for example, about 30% to about 60%, for example, about 1% to about 20%, for example, about 2% to about 20%, and for example, about 4% to about 15%. The window 30 has such a light transmittance, and at the same time, the uppermost end surface of the window 30 and the polishing surface of the polishing layer 10 have the above-described hardness relationship so that both the endpoint detection function by the window 30 and the debris loading effect by the void 15 may be secured excellently.

The window 30 may have a thickness of about 1.5 mm to about 3.0 mm, for example, about 1.5 mm to about 2.5 mm, and for example, about 2.0 mm to 2.2 mm. Since the window 30 satisfies such a thickness range and the above-described light transmittance condition, it may be advantageous that both the endpoint detection function by the window 30 and the debris loading effect by the void 15 are excellently secured.

The window 30 may have a refractive index of about 1.45 to about 1.60, for example, about 1.50 to about 1.60 with respect to a thickness of about 2 mm. Since the window 30 simultaneously satisfies the above-described light transmittance condition and refractive index condition in the above-described thickness range, it may be advantageous that both the endpoint detection function by the window 30 and the debris loading effect by the void 15 are excellently secured.

In one embodiment, the polishing layer 10 may include a foamed cured product of the polishing layer composition comprising the second urethane-based prepolymer. The polishing layer 10 may have a pore structure by including a foamed cured product, and such a pore structure may perform the function of properly securing the fluidity of a polishing slurry applied to the polishing surface and the physical friction force with the surface to be polished of the polishing target by forming a surface roughness on the polishing surface that cannot be formed with a non-foamed cured product. The 'prepolymer' refers to a polymer having a relatively low molecular weight in which the polymerization degree is stopped at an intermediate stage to facilitate molding in the cured product production. The prepolymer itself may be subjected to an additional curing process such as heating and/or pressurization, or mixed and reacted with other polymerizable compound, for example, an additional compound such as a heterogeneous monomer or a heterogeneous prepolymer, and then molded into a final cured product.

The second urethane-based prepolymer may be prepared by reacting a second isocyanate compound and a second polyol compound. The second isocyanate compound may include one selected from the group consisting of an aromatic diisocyanate, an aliphatic diisocyanate, an alicyclic diisocyanate, and combinations thereof. In one embodiment, the second isocyanate compound may include an aromatic diisocyanate. For example, the second isocyanate compound may include an aromatic diisocyanate and an alicyclic diisocyanate.

The second isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidinediisocyanate, 4,4'-diphenylmethanediisocyanate, hexamethylenediisocyanate, dicyclohexylmethanediisocyanate, 4,4'-dicyclohexylmethanediisocyanate ($H_{12}$MDI), isophorone diisocyanate, and combinations thereof.

The second polyol compound may include, for example, one selected from the group consisting of a polyether polyol, a polyester polyol, a polycarbonate polyol, an acrylic polyol, and combinations thereof. The 'polyol' refers to a compound containing at least two hydroxyl groups (—OH) per molecule. In one embodiment, the second polyol compound may include a dihydric alcohol compound having two hydroxyl groups, that is, a diol or a glycol. In one embodiment, the second polyol compound may include a polyether polyol.

The second polyol compound may include, for example, one selected from the group consisting of polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol (PPG), and combinations thereof.

In one embodiment, the second polyol compound may include a low molecular weight polyol having a weight average molecular weight (Mw) of about 100 g/mol or more and about less than 300 g/mol, and a high molecular weight polyol having a weight average molecular weight (Mw) of about 300 g/mol or more and about 1,800 g/mol or less. The low molecular weight polyol and high molecular weight polyol having the above-mentioned weight average molecular weight ranges are appropriately mixed and used as the second polyol compound so that a foamed cured product having an appropriate crosslinked structure may be formed from the second urethane-based prepolymer, and it may be more advantageous for the polishing layer 10 to form a foamed structure having desired physical properties such as hardness and pores of an appropriate size.

The second urethane-based prepolymer may have a weight average molecular weight (Mw) of about 500 g/mol to about 3,000 g/mol, for example, about 600 g/mol to about 2,000 g/mol, and for example, about 800 g/mol to about 1,000 g/mol. Since the second urethane-based prepolymer has a degree of polymerization corresponding to the above-described weight average molecular weight (Mw) range, the polishing layer composition is foamed and cured under predetermined process conditions so that it may be more advantageous to form the polishing layer 10 with a polishing surface having an appropriate surface hardness correlation with the window 30 in relation to the structure of the void 15.

In one embodiment, the second isocyanate compound may include an aromatic diisocyanate and an alicyclic diisocyanate. The aromatic diisocyanate may include, for example, 2,4-toluenediisocyanate (2,4-TDI) and 2,6-toluenediisocyanate (2,6-TDI), wherein the alicyclic diisocyanate may include dicyclohexylmethanediisocyanate ($H_{12}$MDI). Further, the second polyol compound may include, for example, polytetramethylene ether glycol (PTMG) and diethylene glycol (DEG).

In the polishing layer composition, the total amount of the second polyol compound may be about 100 parts by weight to about 250 parts by weight, for example, about 110 parts by weight to about 250 parts by weight, for example, about 110 parts by weight to about 240 parts by weight, for example, about 110 parts by weight to about 200 parts by weight, for example, about 110 parts by weight to about 180 parts by weight, and for example, about 110 parts by weight or more and about less than 150 parts by weight based on 100 parts by weight of the total amount of the second isocyanate compound in the total components for preparing the second urethane-based prepolymer.

In the polishing layer composition, the second isocyanate compound may include the aromatic diisocyanate, the aromatic diisocyanate may include 2,4-TDI and 2,6-TDI, and the content of 2,6-TDI may be about 1 part by weight to about 40 parts by weight, for example, about 1 part by weight to about 30 parts by weight, for example, about 10 parts by weight to about 30 parts by weight, and for example, about 15 parts by weight to about 30 parts by weight based on 100 parts by weight of 2,4-TDI.

In the polishing layer composition, the second isocyanate compound may include the aromatic diisocyanate and the alicyclic diisocyanate, and the total content of the alicyclic diisocyanate may be about 5 parts by weight to about 30 parts by weight, for example, about 5 parts by weight to about 25 parts by weight, for example, about 5 parts by weight to about 20 parts by weight, and for example, about 5 parts by weight or more and about less than 15 parts by weight based on 100 parts by weight of the total content of the aromatic diisocyanate.

The relative content ratios of the respective components of the polishing layer composition satisfy the above-mentioned ranges individually or simultaneously, and thus the polishing surface of the polishing layer 10 prepared therefrom may have an appropriate pore structure and surface hardness. Accordingly, the polishing surface of the polishing layer 10 may form an appropriate surface hardness correlation with the uppermost end surface of the window 30 in which the relative content ratios of the respective components satisfy the above-mentioned conditions individually or simultaneously, and it ensures that the gap by the opening 16 of the void does not substantially negatively affect the realization of the desired polishing performance so that it may be more advantageous for the void 15 to excellently perform the debris-loading function.

The polishing layer composition may have an isocyanate group content (NCO %) of about 6% by weight to about 12% by weight, for example, about 6% by weight to about 10% by weight, and for example, about 6% by weight to about 9% by weight. The isocyanate group content means a percentage by weight of an isocyanate group (—NCO) present as a free reactive group without being subjected to a urethane reaction in the total weight of the preliminary composition. The isocyanate group content may be designed by comprehensively controlling the type and content of the second isocyanate compound and the second polyol compound for preparing the second urethane-based prepolymer, the conditions such as temperature, pressure, time, etc. of the process for preparing the second urethane-based prepolymer, and the type and content of additives used in the preparation of the second urethane-based prepolymer. When the isocyanate group content of the polishing layer composition satisfies the above range, the polishing layer composition may be foamed and cured to secure an appropriate surface hardness, and it may be advantageous to secure an appropriate hardness correlation with the window in relation to the void structure and the debris loading effect thereof.

The polishing layer composition may further comprise a curing agent. The curing agent is a compound for chemically reacting with the second urethane-based prepolymer to form a final cured structure in the polishing layer, and may include, for example, an amine compound or an alcohol compound. Specifically, the curing agent may include one selected from the group consisting of aromatic amines, aliphatic amines, aromatic alcohols, aliphatic alcohols, and combinations thereof.

The curing agent may include, for example, one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylylenediamine, isophorone diamine, ethylenediamine, diethylenetriamine, triethylenetetramine, polypropylenediamine, polypropylenetriamine, bis(4-amino-3-chlorophenyl) methane, and combinations thereof.

The curing agent may be contained in an amount of about 18 parts by weight to about 28 parts by weight, for example, about 19 parts by weight to about 27 parts by weight, and for example, about 20 parts by weight to about 26 parts by weight, based on 100 parts by weight of the polishing layer composition.

In one embodiment, the curing agent may include an amine compound, and the molar ratio of the isocyanate group (—NCO) in the polishing layer composition to the amine group (—$NH_2$) in the curing agent may be about 1:0.60 to about 1:0.99 and, for example, about 1:0.60 to about 1:0.95.

The polishing layer composition may further comprise a foaming agent. The foaming agent may include one selected from the group consisting of a solid-phase foaming agent, a gas-phase foaming agent, a liquid-phase foaming agent, and combinations thereof as a component for forming a pore structure in the polishing layer. In one embodiment, the foaming agent may include a solid-phase foaming agent, a gas-phase foaming agent, or a combination thereof.

The solid-phase foaming agent may have an average particle diameter of about 5 μm to about 200 μm, for example, about 20 μm to about 50 μm, for example, about 21 μm to about 50 μm, and for example, about 21 μm to about 40 μm. The average particle diameter of the solid-phase foaming agent may mean the average particle diameter of the thermally expanded particles themselves when the solid-phase foaming agent is thermally expanded particles as described below, and it may mean the average particle diameter of the particles after being expanded by heat or pressure when the solid-phase foaming agent is unexpanded particle as described below.

The solid-phase foaming agent may contain expandable particles. The expandable particles are particles having properties of being expandable by heat or pressure, and the size thereof in the final polishing layer may be determined by heat or pressure applied during the manufacturing process of the polishing layer. The expandable particles may include thermally expanded particles, unexpanded particles, or a combination thereof. The thermally expanded particles are particles pre-expanded by heat, and refer to particles having a small or almost no size change due to heat or pressure applied during the manufacturing process of the polishing layer. The unexpanded particles are particles that have not been pre-expanded, and refer to particles which are expanded by heat or pressure applied during the manufacturing process of the polishing layer to determine their final size.

The expandable particles may include: a resin material shell; and an expansion-inducing component present in the inside encapsulated by the shell.

For example, the shell may include a thermoplastic resin, and the thermoplastic resin may be one or more selected from the group consisting of a vinylidene chloride-based copolymer, an acrylonitrile-based copolymer, a methacrylonitrile-based copolymer, and an acrylic copolymer.

The expansion-inducing component may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

The solid-phase foaming agent may optionally include inorganic component-treated particles. For example, the solid-phase foaming agent may contain inorganic component-treated expandable particles. In one embodiment, the solid-phase foaming agent may contain silica ($SiO_2$) particle-treated expandable particles. The inorganic component treatment of the solid-phase foaming agent may prevent aggregation between a plurality of particles. The inorganic component-treated solid-phase foaming agent may have different chemical, electrical, and/or physical properties on the foaming agent surface from the inorganic component-untreated solid-phase foaming agent.

The solid-phase foaming agent may be contained in an amount of about 0.5 parts by weight to about 10 parts by weight, for example, about 1 part by weight to about 3 parts by weight, for example, about 1.3 parts by weight to about 2.7 parts by weight, and for example, about 1.3 parts by weight to about 2.6 parts by weight, based on 100 parts by weight of the urethane-based prepolymer.

The type and content of the solid-phase foaming agent may be designed depending on the desired pore structure and physical properties of the polishing layer.

The gas-phase foaming agent may include an inert gas. The gas-phase foaming agent may be used as a pore-forming element by being injected in a process in which the second urethane-based prepolymer and the curing agent are reacted.

The type of the inert gas is not particularly limited as long as it is a gas that does not participate in the reaction between the second urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gas-phase foaming agent may be designed depending on the desired pore structure and physical properties of the polishing layer.

In one embodiment, the foaming agent may include a solid-phase foaming agent. For example, the foaming agent may consist only of a solid-phase foaming agent.

The solid-phase foaming agent may contain expandable particles, and the expandable particles may include thermally expanded particles. For example, the solid-phase foaming agent may consist only of thermally expanded particles. When the solid-phase foaming agent consists only of the thermally expanded particles without containing the unexpanded particles, the variability of the pore structure is reduced, but the predictability is increased so that it may be advantageous to implement homogeneous pore properties over the entire region of the polishing layer.

In one embodiment, the thermally expanded particles may be particles having an average particle diameter of about 5 μm to about 200 μm. The thermally expanded particles may have an average particle diameter of about 5 μm to about 100 μm, for example, about 10 μm to about 80 μm, for example, about 20 μm to about 70 μm, for example, about 20 μm to about 50 μm, for example, about 30 μm to about 70 μm, for example, about 25 μm to about 45 μm, for example, about 40 μm to about 70 μm, and for example, about 40 μm to about 60 μm. The average particle diameter is defined as D50 of the thermally expanded particles.

In one embodiment, the thermally expanded particles may have a density of about 30 kg/m to about 80 kg/m, for example, about 35 kg/m to about 80 kg/m, for example, about 35 kg/m to about 75 kg/m, for example, about 38 kg/m to about 72 kg/m, for example, about 40 kg/m to about 75 kg/m, and for example, about 40 kg/m to about 72 kg/m.

In one embodiment, the foaming agent may include a gas-phase foaming agent. For example, the foaming agent may include a solid-phase foaming agent and a gas-phase foaming agent. Matters regarding the solid-phase foaming agent are the same as described above.

The gas-phase foaming agent may be injected through a predetermined injection line during a process in which the second urethane-based prepolymer, the solid-phase foaming agent, and the curing agent are mixed. The gas-phase foaming agent may have an injection rate of about 0.8 L/min to about 2.0 L/min, for example, about 0.8 L/min to about 1.8 L/min, for example, about 0.8 L/min to about 1.7 L/min, for example, about 1.0 L/min to about 2.0 L/min, for example, about 1.0 L/min to about 1.8 L/min, and for example, about 1.0 L/min to about 1.7 L/min.

The polishing layer composition may further comprise an additive as needed. The type of the additive may include one selected from the group consisting of a surfactant, a pH adjuster, a binder, an antioxidant, a heat stabilizer, a dispersion stabilizer, and combinations thereof. The names such as ‘surfactant’ and ‘antioxidant’ are arbitrary names based on the main role of the corresponding material, and each corresponding material does not necessarily perform only a function limited to the role by the corresponding name.

The surfactant is not particularly limited as long as it is a material that serves to prevent a phenomenon such as aggregation or overlapping of pores. For example, the surfactant may include a silicone-based surfactant.

The surfactant may be used in an amount of about 0.2 parts by weight to about 2 parts by weight based on 100 parts by weight of the second urethane-based prepolymer. Specifically, the surfactant may be contained in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, and for example, about 0.5 parts by weight to about 1.5 parts by weight, based on 100 parts by weight of the second urethane-based prepolymer. When the surfactant is contained in an amount within the above range, pores derived from the gas-phase foaming agent may be stably formed and maintained in the mold.

The reaction rate controlling agent serves to promote or delay the reaction, and a reaction accelerator, a reaction retarder, or both thereof may be used depending on the purpose. The reaction rate controlling agent may include a reaction accelerator. For example, the reaction accelerator may be one or more reaction accelerators selected from the group consisting of a tertiary amine-based compound and an organometallic compound.

Specifically, the reaction rate controlling agent may include one or more selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl) ether, trimethylaminoethylethanolamine, N,N,N',N",N'"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanovonein, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may include one or more selected from the group consisting of benzyldimethylamine, N,N-dimethylcyclohexylamine, and triethylamine.

The reaction rate controlling agent may be used in an amount of about 0.05 parts by weight to about 2 parts by weight, for example, about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, and for example, about 0.5 parts by weight to about 1 part by weight, based on 100 parts by weight of the second urethane-based prepolymer. When the reaction rate controlling agent is used in the aforementioned amount range, the polishing layer having the desired pore size and hardness may be formed by appropriately controlling the curing reaction rate of the preliminary composition.

Figure 5:
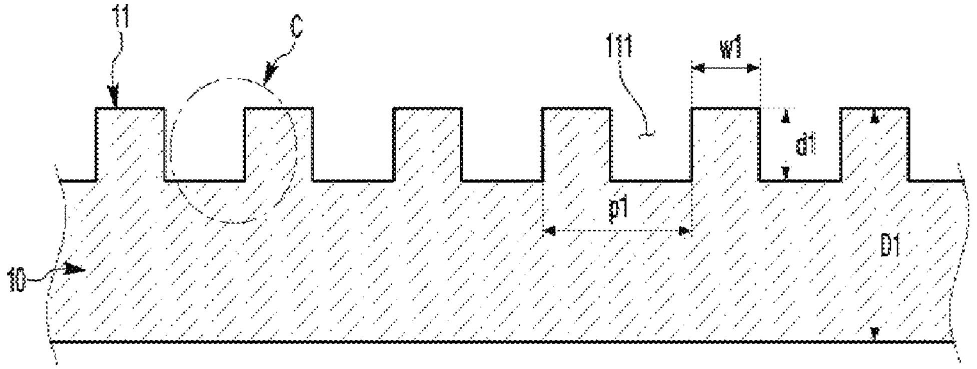
FIG. 5 schematically illustrates an enlarged view of a portion of the first surface 11 that is the polishing surface of the polishing layer 10.

FIG. 5 schematically illustrates an enlarged view of a portion of the first surface 11 that is the polishing surface of the polishing layer 10. Referring to FIG. 5, the first surface 11 may include at least one groove 111. The groove 111 is a groove structure processed to a depth d1 smaller than the thickness D1 of the polishing layer 10, and may perform the function of securing the fluidity of the liquid component such as a polishing slurry, a cleaning solution, or the like applied onto the first surface 11 during the polishing process.

In one embodiment, the planar structure of the polishing pad 100 may be substantially circular, and the at least one groove 111 may be a concentric circular structure disposed to be spaced apart from the center on the plane of the polishing layer 10 toward the end thereof at predetermined intervals. In another embodiment, the at least one groove 111 may be a radial structure continuously formed from the center on the plane of the polishing layer 10 toward the end thereof. In another embodiment, the at least one groove 111 may include a concentric circular structure and a radial structure at the same time.

In one embodiment, the polishing layer may have a thickness (D1) of from about 0.8 mm to about 5.0 mm, for example, about 1.0 mm to about 4.0 mm, for example, about 1.0 mm to 3.0 mm, for example, about 1.5 mm to about 3.0 mm, for example, about 1.7 mm to about 2.7 mm, and for example, about 2.0 mm to about 3.5 mm.

In one embodiment, the groove 111 may have a width w1 of about 0.1 mm to about 20 mm, for example, about 0.1 mm to about 15 mm, for example, about 0.1 mm to about 10 mm, for example, about 0.1 mm to about 5 mm, and for example, about 0.1 mm to about 1.5 mm.

In one embodiment, the groove 111 may have a depth d1 of about 100 μm to about 1,500 μm, for example, about 200 μm to about 1,400 μm, for example, about 300 μm to about 1,300 μm, for example, about 400 μm to about 1,200 μm, for example, about 400 μm to about 1,000 μm, and for example, about 400 μm to about 800 μm.

In one embodiment, when the first surface 11 includes a plurality of grooves 111, and the plurality of grooves 111 include concentric circular grooves, the concentric circular grooves may have a pitch (p1) between two adjacent grooves 111 of about 2 mm to about 70 mm, for example, about 2 mm to about 60 mm, for example, about 2 mm to about 50 mm, for example, about 2 mm to about 35 mm, for example, about 2 mm to about 10 mm, and for example, about 2 mm to about 8 mm.

The at least one groove 111 satisfies each or all of the depth (d1), width (w1), and pitch (p1) in the above-mentioned ranges so that the fluidity of the polishing slurry realized through this may load only debris, which is an impurity, into the voids 15, and components such as abrasive particles that should perform an effective polishing function may not be loaded into the voids 15, but may be expressed a flow rate that is suitable for performing their original functions. To put it another way, when the depth (d1), width (w1), and pitch (p1) of the at least one groove 111 are out of the above-mentioned ranges so that the fluidity of the polishing slurry implemented through this is excessively fast, or the flow rate per unit time is excessively high, there is a concern that the polishing slurry components may not perform their intended functions and may be discharged out of the polishing surface. On the contrary, when the fluidity of the polishing slurry is excessively slow, or the flow rate per unit time is excessively small, the slurry components, which should perform a physical and chemical polishing function on the polishing surface, do not perform their intended functions and are loaded into the voids 15 so that there is a concern that it may spatially interfere with the function of loading the debris in the voids 15.

Figure 6:
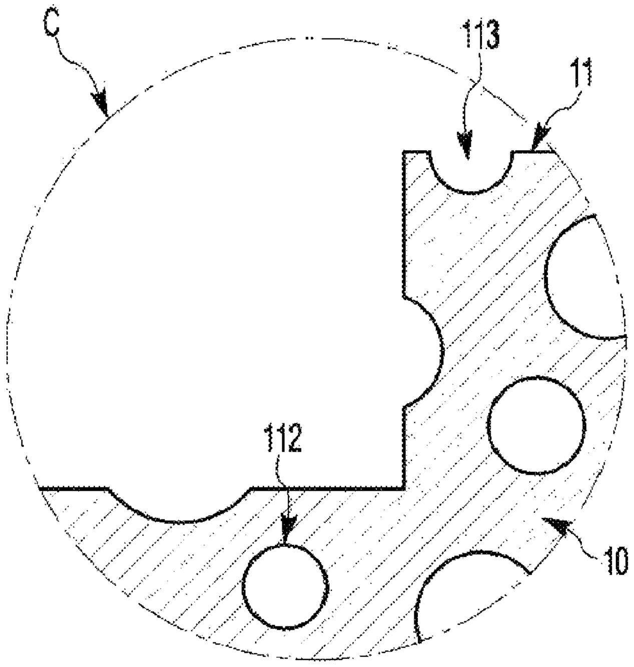
FIG. 6 schematically illustrates an enlarged view of part C of FIG. 5.

The polishing layer 10 may include a foamed cured product of the polishing layer composition, and may be a porous structure including a plurality of pores. FIG. 6 schematically illustrates an enlarged view of part C of FIG. 5. Referring to FIG. 6, the plurality of pores 112 are dispersed throughout the polishing layer 10, and may serve to continuously create a predetermined roughness on the surface even in a process in which the polishing surface 11 is ground by a conditioner or the like during the polishing process. That is, the plurality of pores 112 may be partially exposed to the outside on the first surface 11 of the polishing layer 10 to appear as fine concave portions 113 distinguished from the grooves 111. The fine concave portions 113 may perform a function of determining the fluidity and mooring space of the polishing liquid or polishing slurry together with the grooves 111 during use of the polishing pad 100, and may perform a function of physically providing frictional force to polishing of the surface to be polished.

The first surface 11 may have a predetermined surface roughness due to the fine concave portions 113. In one embodiment, the first surface 11 may have a surface roughness Ra of about 1 μm to about 20 μm, for example, about 2 μm to about 18 μm, for example, about 3 μm to about 16 μm, and for example, about 4 μm to about 14 μm. Since the surface roughness Ra of the first surface 11 satisfies the above range, the fluidity of the polishing slurry by the fine concave portions 113 may be advantageous to be properly secured in relation to the function of loading the debris of the voids 15.

Referring to FIGS. 1 to 3, the polishing pads 100, 200, and 300 may further include a support layer 20 disposed on the second surface 12 side of the polishing layer 10. Further, the support layer 20 may include a second through-hole 14 connected to the first through-hole 13. Connecting the first through-hole 13 and the second through-hole 14 specifically means that the second through-hole 14 is disposed within a region corresponding to the region in which the first through-hole 13 is formed. The first through-hole 13 and the second through-hole 14 have a structure in which they are connected to each other, and the window 30 is disposed within the first through-hole 13 so that the polishing pad can detect an endpoint.

The support layer 20 may serve as a buffer for alleviating external pressure or external impact transmitted to the surface to be polished during the polishing process while supporting the polishing layer 10. Through this, it may contribute to preventing the occurrence of damage and defects to the polishing target in the polishing process to which the polishing pads 100, 200, and 300 are applied.

The support layer 20 may include a nonwoven fabric or suede, but the present disclosure is not limited thereto. In one embodiment, the support layer 20 may include a nonwoven fabric. The 'nonwoven fabric' refers to a three-dimensional reticular structure of nonwoven fibers. Specifically, the support layer 20 may include a nonwoven fabric and a resin impregnated in the nonwoven fabric.

The nonwoven fabric may be, for example, a nonwoven fabric of fibers including one selected from the group consisting of polyester fibers, polyamide fibers, polypropylene fibers, polyethylene fibers, and combinations thereof.

The resin impregnated in the nonwoven fabric may include, for example, one selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof:

In one embodiment, the support layer 20 may include a nonwoven fabric of fibers including polyester fibers impregnated with a resin including a polyurethane resin. In this case, in a region in the vicinity of which the window 30 is disposed, the supporting performance of the window 30 of the support layer 20 may be excellently implemented. In implementing the function of loading the debris by the voids 15, it may be advantageous for the uppermost end surface of the support layer 20 to safely load the debris loaded without leaking.

The support layer 20 may have a thickness of, for example, about 0.5 mm to about 2.5 mm, for example, about 0.8 mm to about 2.5 mm, for example, about 1.0 mm to about 2.5 mm, for example, about 1.0 mm to about 2.0 mm, and for example, about 1.2 mm to about 1.8 mm.

Referring to FIGS. 1 to 3, the support layer 20 includes a third surface 21 on the polishing layer 10 side and a fourth surface 22 that is a rear surface thereof, the second through-hole 14 is smaller than the first through-hole 13, and the window 30 may be supported by the third surface 21. The second through-hole 14 is formed to a size smaller than that of the first through-hole 13, and the second through-hole 14 is disposed to be connected to the first through-hole 13 so that a region capable of supporting the window 30 is created in the third surface 21, whereby the window 30 supporting surface of the third surface 21 constitutes one surface of the void 15 so that a pocket structure capable of loading the debris may be created.

Referring to FIG. 1, the vertical distance D2 between the side surface of the first through-hole 13 and the side surface 14 of the second through-hole may be about 1 mm to about 5 mm, for example, about 2 mm to about 5 mm, for example, about 2.5 mm to about 4.5 mm, and for example, about 3 mm to about 4 mm. Accordingly, it may be advantageous that the function of loading the debris inside the void 15 of the third surface 21 and the function of supporting the window 30 are simultaneously excellently implemented, and it may be advantageous to effectively prevent a defect in which a fluid derived from a liquid component, such as a polishing slurry, a cleaning solution, or the like applied onto the first surface 11, leaks through the second through-hole 14 to the polishing device.

Referring to FIGS. 1 to 3, the polishing pads 100, 200, and 300 may include a first adhesive layer 40 for attaching the polishing layer 10 and the support layer 20. The first adhesive layer 40 may include, for example, a heat sealing adhesive. Specifically, the first adhesive layer 40 may include one selected from the group consisting of a urethane-based adhesive, an acrylic adhesive, a silicone-based adhesive, and combinations thereof, but the present disclosure is not limited thereto.

The polishing pads 100, 200, and 300 according to one embodiment may further include a second adhesive layer 50 on the lower surface of the support layer 20, that is, on the fourth surface 22 serving as a surface plate attachment surface. The second adhesive layer 50 is a medium for attaching the polishing pads 100, 200, and 300 and the surface plate of the polishing device, and may be derived from, for example, a pressure sensitive adhesive (PSA), but the present disclosure is not limited thereto.

Figure 7:
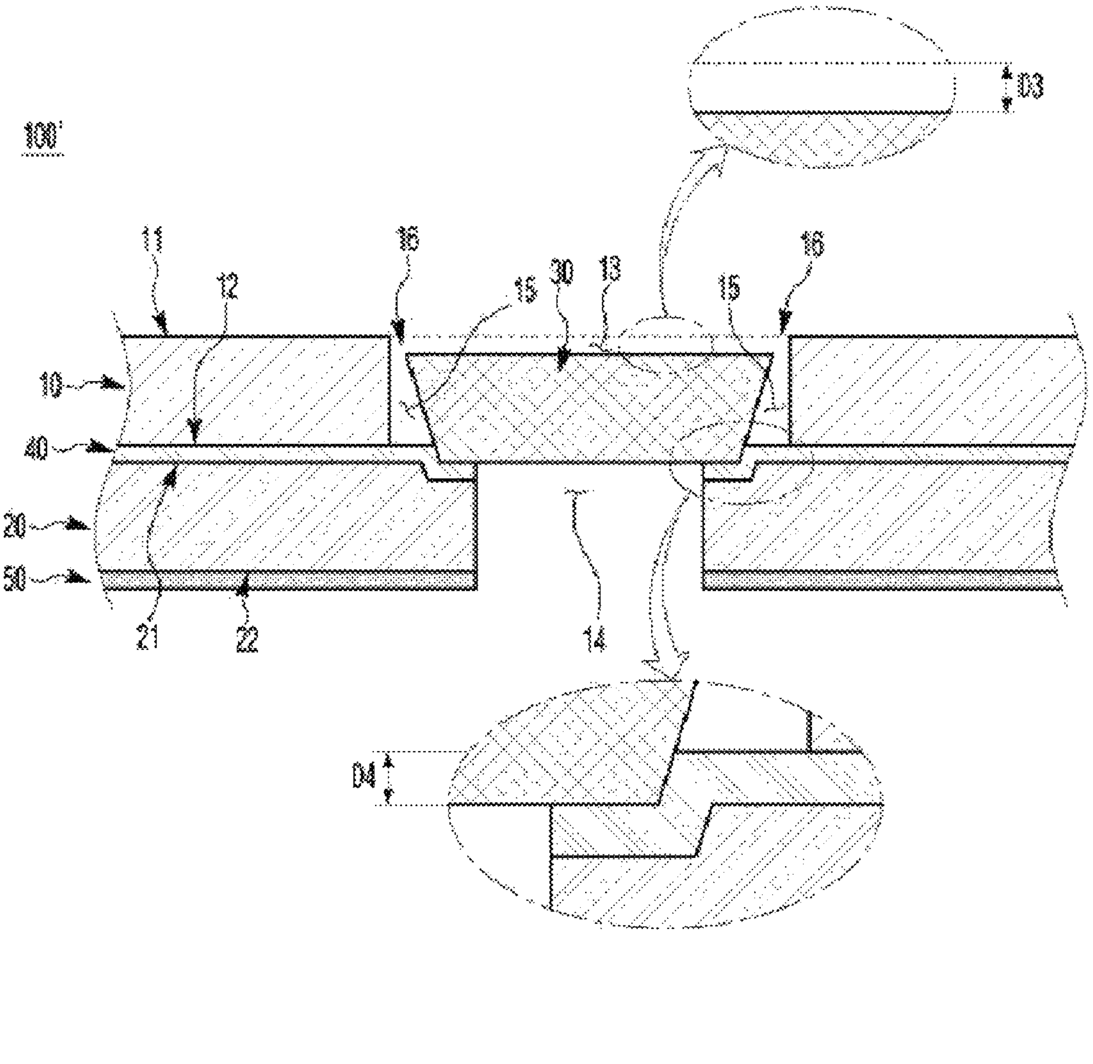
FIG. 7 schematically illustrates a cross section in the thickness direction of the polishing pad according to another embodiment.

FIG. 7 schematically illustrates a cross section in the thickness direction of the polishing pad 100' according to another embodiment. Referring to FIG. 7, the height of the uppermost end surface of the window 30 may be lower than the height of the first surface 11, which is the polishing surface of the polishing layer 10. Since the uppermost end surface of the window 30 has a height lower than that of the first surface 11, the inflow of debris through the opening 16 of the void may be more smoothly.

For example, the height difference D3 between the uppermost end surface of the window 30 and the first surface 11 may be about 0.001 mm to about 0.05 mm, for example, about 0.01 mm to about 0.05 mm, and for example, about 0.02 mm to about 0.03 mm.

Referring to FIG. 7, the height of the lowermost end surface of the window 30 may be lower than that of the second surface 12, which is the lower surface of the polishing layer 10. Since the lowermost end surface of the window 30 has a height lower than that of the second surface 12, the debris loaded in the void 15 may be effectively stagnated without being leaked in the second through-hole 14 direction, and the fluid derived from the polishing slurry or cleaning solution applied onto the first surface 11 flows into the lowermost end surface of the window 30 or the second through-hole 14 so that it may be advantageous to effectively prevent driving of the polishing device from being negatively affected.

For example, the height difference D4 between the lowermost end surface of the window 30 and the second surface 12 may be about 0.1 mm to about 1.0 mm, for example, about 0.1 mm to about 0.6 mm, for example, about 0.2 mm to about 0.6 mm, and for example, about 0.2 mm to about 0.4 mm.

In another embodiment, there is provided a polishing pad including: a polishing layer including a first surface that is a polishing surface and a second surface that is a rear surface thereof, and containing a first through-hole penetrating from the first surface to the second surface; and a window disposed in the first through-hole, wherein a void is contained between a side surface of the first through-hole and a side surface of the window, an opening of the void is contained between the first surface and an uppermost end surface of the window, and a value of Equation 1 below is more than 0.00 and 15.00 or less.

$$W \times (1-D) \qquad \text{[Equation 1]}$$

In Equation 1, W is a width value (μm) of the opening of the void, and D is a volume ratio value of the window to the volume 1.00 of the first through-hole in the polishing layer.

As described above, the polishing pad may introduce a window as a part of the polishing layer in order to secure an endpoint detection function. However, the window is a configuration having properties and material that are somewhat different from those of the polishing layer, and may create a locally heterogeneous portion on the polishing surface of the polishing layer, and there is a concern that such a local heterogeneity may lower the overall polishing performance provided to the surface to be polished of the semiconductor substrate by the polishing surface. From this point of view, the polishing pad according to one embodiment contains a void between the side surface of the first through-hole and the side surface of the window, contains an opening of the void between the first surface and the uppermost end surface of the window, and has characteristics that the value of Equation 1 above is more than 0.00 and 15.00 or less so that it is possible to obtain an effect that the local heterogeneity of the window rather contributes to the improvement of polishing performance.

Referring to FIGS. 1 to 7, even if all the features of the polishing pads 100, 100', 200, and 300 described above are not only repeatedly described later, but also not repeatedly described later, all of them may be equally integrated and applied with respect to the polishing pad according to the present embodiment.

The void 15 refers to an empty space between the side surface of the first through-hole 13 and the side surface of the window 30, and the polishing pads 100, 100', 200, and 300 contain the void 15, and satisfy the value of Equation 1 above of about more than 0.00 and about 15.00 or less, thereby maximizing the function of loading or accommodating debris, which is a defect-occurrence element during polishing.

In Equation 1, W is a numerical value representing the width of the opening 16 of the void in unit of micrometers (μm), and D is a numerical value indicating the ratio of the volume of the window 30 to the volume 1.00 of the first through-hole 13 in the polishing layer 10. Equation 1 above is an equation value calculated using only each numerical value, and is expressed as a value without a unit.

In the calculation of D, the volume of the first through-hole 13 in the polishing layer 10 is calculated by multiplying the width, length, and height of the boundary corner of the first through-hole 13 and the polishing layer 10. The volume of the window 30 may be derived by a method of obtaining the volume of a truncated pyramid. More specifically, the volume of the window 30 may be derived by a method of obtaining the volume of a quadrangular truncated pyramid. That is, after measuring the width and length of a surface with a relatively wide area out of the upper and lower surfaces of the window 30, and measuring the width and length of a surface with a relatively narrow area, the thickness of the window 30 is measured to calculate an expected height of a pyramid having a surface with a relatively wide area out of the upper and lower surfaces of the window 30 as a bottom surface, and a volume (first volume) of the pyramid is derived. Subsequently, a volume of the window 30 may be calculated by calculating a volume (second volume) of a pyramid having a surface with a relatively narrow area out of the upper and lower surfaces of the window 30 as a bottom surface, and subtracting the volume (second volume) from the first volume.

The width W of the opening 16 of the void determines the size of debris flowing into the void 15 during polishing, and the ratio (D) of the volume of the window 30 to the volume of the first through-hole 13 determines the amount of a loadable debris in the void 15. Accordingly, although the void 15 is a locally heterogeneous structure on the polishing surface, Equation 1 above using W and D as constituent factors does not negatively affect the overall polishing performance, and rather has technical significance as an index indicating that it positively contributes to effects such as defect prevention and the like through loading of the debris.

Specifically, the value of Equation 1 above may be about more than 0.00 and about 15.00 or less, for example, about more than 0.00 and about 14.50 or less, for example, about more than 0.00 and about 14.00 or less, for example, about more than 0.00 and about 12.00 or less, for example, about more than 0.00 and about 11.00 or less, for example, about more than 0.00 and about less than 11.00, for example, about 5.00 or more and about less than 11.00, for example, about 5.00 to about 10.00, and for example, about 5.00 to about 9.00.

The opening 16 of the void may have a width W of about more than 0.00 μm, for example, about 50 μm to about 500 μm, for example, about 50 μm to about 450 μm, for example, about 50 μm to about 400 μm, for example, about 50 μm to about 350 μm, for example, about 50 μm to about 300 μm, and for example, about 50 μm or more and about less than 300 μm. When the width of the opening is excessively large, there is a concern that even slurry components effectively functioning for polishing in addition to debris negatively affecting polishing may be confined in the void 15. Meanwhile, when the width of the opening is excessively small, since the debris that should be removed is not moved into the void 15, there is a concern that the void 15 may not perform a desired function. That is, since the opening 16 of the void has a width within an appropriate range, it may be advantageous to effectively trap only the debris that should be a removal target, thereby effectively improving the polishing performance.

The volume ratio value (D) of the window 30 to the volume 1.00 of the first through-hole 13 may be about 0.900 to about 0.999, for example, about 0.920 to about 0.999, for example, about 0.940 to about 0.999, for example, about 0.950 to about 0.980, and for example, about 0.960 to about 0.980. Since the volume ratio value D satisfies the above range, the amount of the debris loaded into the void 15 may be secured at an appropriate level.

Although the volume of the void 15 represented by the volume ratio value D of the window 30 to the volume 1.00 of the first through-hole 13 is sufficiently large, if the width value D of the opening 16 is excessively small, inflow itself of the debris may be difficult. Although the width value D of the opening 16 is sufficiently large, if the volume of the void 15 is excessively small, loading itself of the debris may be difficult. That is, Equation 1 above using W and D as constituent factors is one which represents their organic interrelationship as a numerical value in an appropriate range, and it may be seen that meaning of the technical index is great.

Specifically, the amount of debris loaded in the void 15 may be about more than 0.1 mg and about 1.00 mg or less, for example, about more than 0.1 mg and about less than 0.9 mg, for example, about 0.3 mg to about 0.9 mg, and for example, about 0.5 mg to about 0.8 mg. If the amount of the debris loaded into the void 15 is excessively small, the debris loading function of the void 15 is not implemented to the desired level, and thus there is a concern that the debris remaining on the polishing surface may cause the occurrence of defects. If the amount of the debris loaded into the void 15 is excessively large, loaded debris is discharged back onto the polishing surface so that it may cause the occurrence of defects, or slurry components that should effectively function for polishing are contained in the debris so that there may be a concern that polishing performance is reduced. In one embodiment, the loading amount in the void may be derived by polishing . . . a substrate having a silicon oxide film as a surface to be polished using the polishing pad 100, performing polishing for 1 hour while performing conditioning under pressurized conditions of a 3 lb load using a conditioner (CI45, Saesol Diamond), disassembling the window portion to wash the debris loaded in the void with DI-water and store it, and then vaporizing all the liquid, thereby measuring the weight of the remaining solid materials.

In one embodiment, in the polishing pad, the value of Equation 1 above satisfies the above-mentioned range, and the Shore D hardness of the first surface 11 of the polishing layer 10 may be less than or equal to the Shore D hardness of the uppermost end surface of the window 30 at the same time. For example, the Shore D hardness of the first surface 11 of the polishing layer 10 may be less than the Shore D hardness of the uppermost end surface of the window 30. For example, a difference between the Shore D hardness of the first surface 11 of the polishing layer and the Shore D hardness of the uppermost end surface of the window 30 may be about 0 to about 20, for example, about more than 0 and about 20 or less, for example, about 1 to about 20, for example, about 1 to about 15, for example, about 5 to about 15, and for example, about 5 to about 10. Here, the Shore D hardness is a value measured in a room temperature dry state. The 'room temperature dry state' means a state without a wet treatment to be described later at one temperature in the range of about 20° C. to about 30° C. Since the opening 16 of the void is a structure positioned at the boundary between the first surface 11 and the uppermost end surface of the window 30, and has an open structure that is about more than 0.00 μm, if the surface properties of the first surface 11 and the uppermost end surface of the window 30 do not have an appropriate correlation, there is a concern of causing defects such as scratches on a semiconductor substrate or the like that is a polishing target due to a gap therebetween. From this point of view, the Shore D hardness difference between the first surface 11 and the uppermost end surface of the window 30 satisfies the above range so that the gap by the opening 16 of the void may maximize the technical advantage of the void 15 according to the range of Equation 1 above without negatively affecting the surface of the semiconductor substrate that is being polished while repeatedly moving to the first surface 11 and the uppermost end surface of the window 30.

In one embodiment, the Shore D hardness of the uppermost end surface of the window 30 may be about 50 to about 75, for example, about 55 to about 70.

In one embodiment, in the polishing pad, the value of Equation 1 above may satisfy the above-mentioned range, and the Shore D wet hardness measured at 30° C. of the first surface 11 of the polishing layer 10 may be less than the Shore D wet hardness measured at 30° C. of the uppermost end surface of the window 30 at the same time. In this case, the Shore D wet hardness is a surface hardness value measured after immersion in water at the corresponding temperature for 30 minutes. For example, the difference between the Shore D wet hardness values measured at 30° C. of the first surface 11 of the polishing layer and the uppermost end surface of the window 30 may be about more than 0 and about 15 or less, for example, about 1 to about 15, and for example, about 2 to about 15.

In one embodiment, the Shore D wet hardness measured at 50° C. of the first surface 11 of the polishing layer may be less than the Shore D wet hardness measured at 50° C. of the uppermost end surface of the window 30. In this case, the Shore D wet hardness is a surface hardness value measured after immersion in water at the corresponding temperature for 30 minutes. For example, the difference in the Shore D wet hardness measured at 50° C. between the first surface 11 of the polishing layer and the uppermost end surface of the window 30 may be about more than 0 and about 15 or less, for example, about 1 to about 25, for example, about 5 to about 25, and for example, about 5 to about 15.

In one embodiment, in the polishing pad, the value of Equation 1 above satisfies the above-mentioned range, and the Shore D wet hardness measured at 70° C. of the first surface 11 of the polishing layer may be less than the Shore D wet hardness measured at 70° C. of the uppermost end surface of the window 30 at the same time. In this case, the Shore D wet hardness is a surface hardness value measured after immersion in water at the corresponding temperature for 30 minutes. For example, the difference between the Shore D wet hardness values measured at 70° C. of the first surface 11 of the polishing layer and the uppermost end surface of the window 30 may be about more than 0 and about 15 or less, for example, about 1 to about 25, for example, about 5 to about 25, and for example, about 8 to about 16.

The polishing process to which the polishing pad is applied is a process in which polishing is mainly performed while applying a liquid slurry onto the first surface 11. Further, the temperature of the polishing process may vary mainly in a range of about 30° C. to about 70° C. That is, the difference in hardness between the first surface 11 and the uppermost end surface of the window 30 derived based on the Shore D hardness measured under a temperature condition and a wet environment similar to the actual process satisfies the above-described range so that it is possible to prevent a gap caused by the opening 16 of the void from negatively affecting the surface of the semiconductor substrate that is being polished while repeatedly moving to the first surface 11 and the uppermost end surface of the window 30. As a result, it is possible to secure the effect of loading the debris by the void 15 and to implement excellent basic polishing performance such as polishing rate and polishing flatness at the same time.

As described above, the window 30 may include a non-foamed cured product of the window composition comprising the first urethane-based prepolymer. All matters regarding the window composition and the first urethane-based prepolymer respectively and sub-composition thereof, and technical advantages thereof are applied in the same manner as described above.

In one embodiment, the window 30 may have a light transmittance of about 1% to about 50%, for example, about 30% to about 85%, for example, about 30% to about 70%, for example, about 30% to about 60%, for example, about 1% to about 20%, for example, about 2% to about 20%, and for example, about 4% to about 15% for light having one wavelength in a wavelength range of about 500 nm to about 700 nm with respect to a thickness of 2 mm. The window 30 has such a light transmittance and, at the same time, the uppermost end surface of the window 30 and the polishing surface of the polishing layer 10 have the above-described hardness relationship so that both the endpoint detection function by the window 30 and the effect of loading the debris by the void 15 can be secured excellently.

The window 30 may have a thickness of about 1.5 mm to about 3.0 mm, for example, about 1.5 mm to about 2.5 mm, and for example, about 2.0 mm to 2.2 mm. Since the window 30 satisfies the foregoing light transmittance condition in the thickness range as described above, it may be advantageous that both the endpoint detection function by the window 30 and the debris loading effect by the void 15 are excellently secured.

The window 30 may have a refractive index of about 1.45 to about 1.60, for example, about 1.50 to about 1.60. Since the window 30 simultaneously satisfies the foregoing light transmittance condition and refractive index condition in the above-mentioned thickness range, it may be advantageous that both the endpoint detection function by the window 30 and the debris loading effect by the void 15 are excellently secured.

As described above, the polishing layer 10 may include a foamed cured product of the polishing layer composition comprising the second urethane-based prepolymer. All matters regarding the polishing layer composition and the second urethane-based prepolymer respectively and sub-composition thereof, and technical advantages thereof are applied in the same manner as described above.

Hereinafter, a method for manufacturing the polishing pad will be described in detail.

There is provided a method for manufacturing a polishing pad, the method comprising steps of: manufacturing a window from a window composition; preparing a polishing layer from a polishing layer composition, the polishing layer including a first surface that is a polishing surface and a second surface that is a rear surface thereof; manufacturing a first through-hole to penetrate from the first surface to the second surface of the polishing layer; and disposing the window in the first through-hole, wherein in the step of disposing the window, the window is disposed so that a void is provided between a side surface of the first through-hole and a side surface of the window, a width of the opening of the void is formed between the uppermost end surface of the window and the first surface, and the opening of the void has a width of 0.00 μm.

The polishing pad manufactured by the method for manufacturing the polishing pad may have a value of Equation 1 below of about more than 0.00 and about 15.00 or less.

$$W\times(1-D) \quad \text{[Equation 1]}$$

In Equation 1, W is a width value (μm) of the opening of the void, and D is a volume ratio value of the window to the volume 1.00 of the first through-hole in the polishing layer.

All matters relating to the technical significance of Equation 1 above and its constituent factors and numerical ranges may be equally integrated and applied to the method for manufacturing the polishing pad as described above with respect to the polishing pad. The optimal process conditions to be described later are applied so that it may be more advantageous to manufacture a polishing pad in which the value of Equation 1 above satisfies a predetermined range by the method for manufacturing the polishing pad.

Referring to FIGS. 1 to 7, even if all the features of the polishing pads 100, 100', 200, and 300 described above are not only repeatedly described later, but also not repeatedly described later, all of them may be equally integrated and applied with respect to the polishing pad according to the present embodiment. The optimal process conditions to be described later are applied so that it may be more advantageous to manufacture a polishing pad having the above-described characteristics by the method for manufacturing the polishing pad.

According to one embodiment, in the step of manufacturing the window, the window may be manufactured so that the ratio of the area of the lowermost end surface of the window 30 to the area 1.000 of the uppermost end surface of the window 30 is about 0.950 or more and about less than 1.000. In this case, the void 15 may have a structure in which the volume decreases in a direction from the first surface 11 to the second surface 12. According to another embodiment, in the step of manufacturing the window, the window may be manufactured so that the ratio of the area of the lowest end surface of the window 30 to the area 1.000 of the uppermost end surface of the window 30 is about more than 1.000 and about 1.050 or less. In this case, the void 15 may have a structure in which the volume increases in a direction from the first surface 11 to the second surface 12. In this way, in manufacturing the window, the window is manufactured so that the ratio of the area of the lowermost end surface of the window 30 to the area 1.000 of the uppermost end surface of the window 30 satisfies a range of about 0.950 or more and about 1.050 or less, and thus it may be advantageous to maximally secure the area for performing the endpoint detection function of the window 30 and to maximize the debris loading efficiency by utilizing the volume gradient of the void 15 at the same time.

In all matters regarding the window composition and the structure (i.e., thickness, volume ratio compared to the first through-hole) and physical properties (i.e., Shore D hardness, light transmittance, refractive index) of the window respectively, both of the foregoing matters regarding the polishing pad and the technical advantages thereof may be equally integrated and applied to the method for manufacturing the polishing pad.

The step of manufacturing a window from the window composition may comprise the steps of: curing the window composition under a temperature condition of about 60° C. to about 90° C. for about 15 minutes to about 20 minutes to prepare a cured window product; and post-curing the cured window product under a temperature condition of about 100° C. to about 150° C. for about 24 hours to about 48 hours. Since the window is manufactured under such process conditions, the uppermost end surface of the window may secure an appropriate surface hardness. As a result, in the operation of the surface to be polished of the polishing target that is being polished while repeatedly reciprocating to the first surface and the uppermost end surface of the window, it may be more advantageous in rather providing a defect prevention effect by positively maximizing only a debris loading function while the gap caused by the void does not have a negative effect such as the occurrence of defects.

In matters regarding the polishing layer composition and the structure (i.e., thickness, pores, grooves, etc.) and physical properties (i.e., Shore D hardness, surface roughness, etc.) of the polishing layer respectively, both of the foregoing matters regarding the polishing pad and the technical advantages thereof may be equally integrated and applied to the method for manufacturing the polishing pad.

The step of preparing the polishing layer from the polishing layer composition may comprise steps of: preparing a mold preheated to a first temperature; preparing a cured polishing layer product by injecting the polishing layer composition into the preheated mold and curing it; and post-curing the cured polishing layer product under a second temperature condition higher than the first temperature.

In one embodiment, the temperature difference between the first temperature and the second temperature may be about 10° C. to about 40° C., for example, about 10° C. to about 35° C., and for example, about 15° C. to about 35° C.

In one embodiment, the first temperature may be about 60° C. to about 100° C., for example, about 65° C. to about 95° C., and for example, about 70° C. to about 90° C. In one embodiment, the curing time of the polishing layer composition under the first temperature may be about 5 minutes to about 60 minutes, for example, about 5 minutes to about 40 minutes, for example, about 5 minutes to about 30 minutes, and for example, about 5 minutes to about 25 minutes.

In one embodiment, the second temperature may be about 100° C. to about 130° C., for example, about 100° C. to about 125° C., and for example, about 100° C. to about 120° C. In one embodiment, the time for post-curing the cured polishing layer product under the second temperature condition may be about 5 hours to about 30 hours, for example, about 5 hours to about 25 hours, for example, about 10 hours to about 30 hours, for example, about 10 hours to about 25 hours, for example, about 12 hours to about 24 hours, and for example, about 15 hours to about 24 hours.

Since the polishing layer composition is cured under the foregoing curing conditions, the first surface of the polishing layer may secure an appropriate surface hardness. As a result, in the operation of the surface to be polished in which the polishing rate and polishing flatness of the surface to be polished by the first surface are implemented at the desired level, and the surface to be polished is polished while repeatedly reciprocating the first surface and the uppermost end surface of the window at the same time, it may be more advantageous in rather providing a defect prevention effect by positively maximizing only a debris loading function while the gap caused by the void does not have a negative effect such as the occurrence of defects.

The step of preparing the polishing layer may further comprise a step of forming at least one groove on the first surface. Both of the matters regarding the grooves and technical advantages thereof are also integrated and applied to the method for manufacturing the polishing pad in the same manner as in the above-described matters regarding the polishing pad. That is, at least one groove is formed on the first surface, and the groove structure is numerically properly designed so that the fluidity of the polishing slurry components applied onto the first surface can be properly secured. As a result, it may be more advantageous that the function of loading the debris in the voids is maximized for the purpose of excluding the loading of the effective polishing components in the polishing slurry and only the debris causing the occurrence of defects.

The step of preparing the polishing layer may further comprise the step of: line turning the first surface; or roughening the first surface. The line turning may be performed by a method of cutting the polishing layer by a predetermined thickness using a cutting tool. The roughening may be performed by a method of processing the surface of the polishing layer with a sanding roller. This surface processing is a step of processing the first surface to realize an optimal polishing rate and polishing flatness, and at the same time, may be performed to adjust the fluidity of a fluid on the first surface in relation to the function of loading the debris of the void.

The method for manufacturing the polishing pad may further comprise steps of: preparing a support layer; attaching the support layer to the second surface side of the polishing layer; and forming a second through-hole having a structure connected to the first through-hole in the support layer. In one embodiment, the steps of: preparing a support layer; attaching the support layer to the second surface side of the polishing layer; and forming a second through-hole having a structure connected to the first through-hole in the support layer may be performed between the steps of preparing the first through-hole; and disposing the window in the first through-hole.

In the step of preparing the support layer, all matters regarding the structure, composition, etc. of the support layer may be all integrated and applied to the method for manufacturing the polishing pad in the same manner as in the above-described matters regarding the polishing pad.

The step of attaching the support layer to the second surface side of the polishing layer may be a step of attaching the support layer through a heat-sealing adhesive. For example, the heat-sealing adhesive may include one selected from the group consisting of a urethane-based adhesive, an acrylic adhesive, a silicone-based adhesive, and combinations thereof, but the present disclosure is not limited thereto. When a heat-sealing adhesive is applied to attach the support layer and the polishing layer, it may be more advantageous in preventing defects in which a fluid derived from a liquid component such as a polishing slurry or a cleaning solution applied onto the first surface passes through the second through-hole and leaks into the polishing device.

In the step of forming the second through-hole, the second through-hole may be formed to be smaller than the first through-hole. Specifically, referring to FIG. 1, in the step of forming the second through-hole, the second through-hole 14 may be prepared such that the vertical distance D2 between the side surface of the first through-hole 13 and the side surface of the second through-hole 14 satisfies about 1 mm to about 5 mm, for example, about 2 mm to about 5 mm, for example, about 2.5 mm to about 4.5 mm, and for example, about 3 mm to about 4 mm.

In the method for manufacturing the polishing pad according to one embodiment, the support layer includes a third surface on the polishing layer side and a fourth surface that is a rear side thereof, and in the step of disposing the window in the first through-hole, the window may be disposed to be supported by the third surface. A portion corresponding to the vertical distance D2 between the side surface of the first through-hole 13 and the side surface of the second through-hole 14 may function as a support surface of the window.

In one embodiment, the step of disposing the window in the first through-hole may further comprise a step of pressurizing the window against the third surface. Referring to FIG. 1, a portion of the third surface 21 corresponding to a vertical distance D2 between a side surface of the first through-hole 13 and a side surface of the second through-hole 14 may function as a support surface of the window 30, and when the window 30 is pressurized against the third surface 21, it may act as a counter surface thereof. In this way, when the process of pressurizing the window 30 against the third surface 21 is applied, the pressurized portion of the support layer forms a denser region than the unpressurized peripheral portion, and this can serve to prevent a defect in which a fluid component that can be flown in through the void passes through the second through-hole 14 and leaks into the polishing device or the like.

Further, when the window 30 is pressurized against the third surface 21, as a result, a structure as shown in FIG. 7 may be formed. That is, the height of the uppermost end surface of the window 30 may be lower than the height of the first surface 11, which is the polishing surface of the polishing layer 10. Since the uppermost end surface of the window 30 has a height lower than that of the first surface 11, the inflow of the debris through the opening 16 of the void may be more smoothly. For example, the height difference D3 between the uppermost end surface of the window 30 and the first surface 11 may be about 0.001 mm to about 0.05 mm, for example, about 0.01 mm to about 0.05 mm, and for example, about 0.02 mm to about 0.03 mm.

The height of the lowermost end surface of the window 30 may be lower than that of the second surface 12, which is the lower surface of the polishing layer 10. Since the lowermost end surface of the window 30 has a height lower than that of the second surface 12, the debris loaded in the void 15 does not leak in the direction of the second through-hole 14 and may stagnate effectively, and the fluid derived from the polishing slurry or cleaning solution applied onto the first surface 11 flows into the lowermost end surface of the window 30 or the second through-hole 14 so that it may be advantageous to effectively prevent a negative influence on driving of the polishing device. For example, the height difference D4 between the lowermost end surface of the window 30 and the second surface 12 may be about 0.1 mm to about 1.0 mm, for example, about 0.1 mm to about 0.6 mm, for example, about 0.2 mm to about 0.6 mm, and for example, about 0.2 mm to about 0.4 mm.

In another embodiment, there is provided a method for manufacturing a semiconductor device, the method comprising steps of: providing a polishing pad having a polishing layer including a first surface that is a polishing surface and a second surface that is a rear surface thereof, including a first through-hole penetrating from the first surface to the second surface, and including a window which is disposed in the first through-hole; and polishing the polishing target while rotating the polishing pad and the polishing target relative to each other under a pressurization condition after disposing the polishing target on the first surface so that the surface to be polished of the polishing target to be in contact with the first surface, wherein the polishing target includes a semiconductor substrate, the polishing pad includes a void between a side surface of the first through-hole and a side surface of the window, an opening of the void is contained between the first surface and an uppermost end surface of the window, and the opening of the void has a width of more than 0.00 μm.

In another embodiment, there is provided a method for manufacturing a semiconductor device, the method comprising steps of: providing a polishing pad having a polishing layer including a first surface that is a polishing surface and a second surface that is a rear surface thereof, including a first through-hole penetrating from the first surface to the second surface, and including a window which is disposed in the first through-hole; and polishing the polishing target while rotating the polishing pad and the polishing target relative to each other under a pressurization condition after disposing the polishing target such that the surface to be polished of the polishing target is in contact with the first surface and the uppermost end surface of the window, wherein the polishing target includes a semiconductor substrate, the polishing pad includes a void between a side surface of the first through-hole and a side surface of the window, an opening of the void is contained between the first surface and an uppermost end surface of the window, and the value of Equation 1 below is more than 0.00 and 15.00 or less.

$$W \times (1-D) \qquad \text{[Equation 1]}$$

In Equation 1, W is a width value (μm) of the opening of the void, and D is a volume ratio value of the window to the volume 1.00 of the first through-hole in the polishing layer.

In the method for manufacturing the semiconductor device, even if all matters regarding the polishing pad are not only repeatedly described later, but also not repeatedly described later, all matters described for the description of the above-described embodiments and their technical advantages may be equally integrated and applied as described below. A semiconductor device manufactured through this can secure high-quality based on excellent polishing result of the semiconductor substrate by applying the polishing pad having the above-described characteristics to the method for manufacturing the semiconductor device.

In one embodiment, the method of manufacturing the semiconductor device may comprise steps of: providing the polishing pad; and polishing the polishing target, wherein the polishing pad may include the void and the opening of the void, and the opening of the void may have a width of about more than 0.00 μm, and the value of Equation 1 of about more than 0.00 and about 15.00 or less.

The opening of the pre may have a width of about more than 0.00 μm, for example, about 50 μm to about 500 μm, for example, about 50 μm to about 450 μm, for example, about 50 μm to about 400 μm, for example, about 50 μm to 350 μm, for example, about 50 μm to about 300 μm, and for example, about 50 μm or more and about less than 300 μm.

The value of Equation 1 may be about more than 0.00 and about 15.00 or less, for example, about more than 0.00 and about 14.50 or less, for example, about more than 0.00 and about 14.00 or less, for example, about more than 0.00 and about 12.00 or less, for example, about more than 0.00 and about 11.00 or less, for example, about more than 0.00 and about less than 11.00, for example, about 5.00 or more and about less than 11.00, for example, about 5.00 to about 10.00, and for example, about 5.00 to about 9.00.

Figure 8:
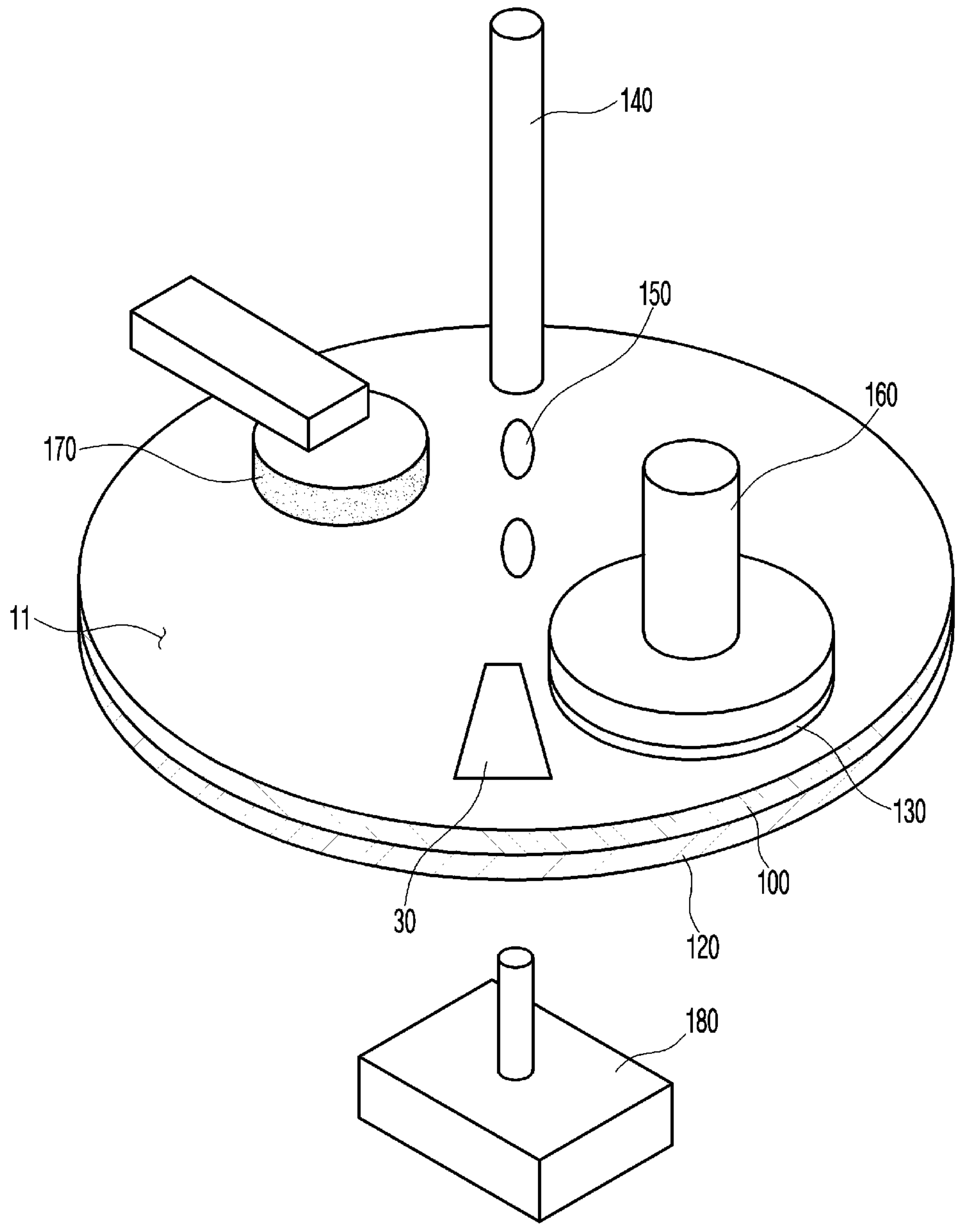
FIG. 8 is a schematic diagram schematically illustrating the method for manufacturing a semiconductor device according to one embodiment.

FIG. 8 is a schematic diagram schematically illustrating the method for manufacturing a semiconductor device according to one embodiment. Referring to FIG. 8, the polishing pad 100 may be provided on the surface plate 120. Referring to FIGS. 1 and 8, the polishing pad 100 may be provided on the surface plate 120 such that the second surface 12 side of the polishing layer 10 faces the surface plate 120. Accordingly, the first surface 11 is a polishing surface, and is disposed to be exposed as the outermost surface.

The polishing target includes a semiconductor substrate 130. The semiconductor substrate 130 may be disposed such that a surface to be polished thereof is in contact with the first surface 11 and the uppermost end surface of the window 30. The surface to be polished of the semiconductor substrate 130 may be in direct contact with the first surface 11 and the uppermost end surface of the window 30, or may be in indirect contact therewith through a fluid slurry or the like. In the present specification, 'contacting' is construed to include both cases of direct or indirect contact.

The semiconductor substrate 130 may be rotationally polished in contact with the first surface 11 and the uppermost end surface of the window 30 while it is being pressurized with a predetermined load in a state in which the semiconductor substrate 130 is mounted on the polishing head 160 so that the surface to be polished of the semiconductor substrate 130 faces the polishing pad 100. The load by which the surface to be polished of the semiconductor substrate 130 is pressurized against the first surface 11 may be selected depending on the purpose, for example, in a range of about 0.01 psi to about 20 psi, and for example, about 0.1 psi to about 15 psi, but the present disclosure is not limited thereto. The surface to be polished of the semiconductor substrate 130 is rotationally polished while contacting the first surface 11 and the uppermost end surface of the window 30 with a load in the above-described range so that, in the process of repeatedly reciprocating the first surface 11 and the uppermost end surface of the window 30, it may be more advantageous to load the debris in the void 15 with an appropriate inflow amount.

The semiconductor substrate 130 and the polishing pad 100 may be rotated relative to each other while the respective surface to be polished and polishing surface are in contact with each other. In this case, the rotation direction of the semiconductor substrate 130 and the rotation direction of the polishing pad 100 may be the same direction or opposite directions. In the present specification, 'relative rotation' is interpreted to include both rotation in the same direction or rotation in opposite directions. The polishing pad 100 is in a mounted state on the surface plate 120 and rotates as the surface plate 120 is rotated, and the semiconductor substrate 130 is in a mounted state on the polishing head 160 and rotates as the polishing head 160 is rotated. The rotation speed of the polishing pad 100 may be selected according to the purpose in a range of about 10 rpm to about 500 rpm, and may be, for example, about 30 rpm to about 200 rpm, but the present disclosure is not limited thereto. The semiconductor substrate 130 may have a rotation speed of about 10 rpm to about 500 rpm, for example, about 30 rpm to about 200 rpm, for example, about 50 rpm to about 150 rpm, for example, about 50 rpm to about 100 rpm, and for example, about 50 rpm to about 90 rpm, but the present disclosure is not limited thereto. When the rotation speeds of the semiconductor substrate 130 and the polishing pad 100 satisfy the above ranges, the fluidity of the slurry due to their centrifugal forces may be properly secured in relation to the effect of loading the debris in the void 15. That is, it may be more advantageous to move the slurry onto the polishing surface at an appropriate flow rate so that the voids 15 do not load the active ingredient of the slurry required for polishing, but only the debris that is cut with a conditioner or the like and causes defects to occur.

The method for manufacturing the semiconductor device may further comprise a step of supplying a polishing slurry 150 onto the first surface 11. For example, the polishing slurry 150 may be sprayed onto the first surface 11 through a supply nozzle 140. The flow rate of the polishing slurry 150 sprayed through the supply nozzle 140 may be, for example, about 10 ml/min to about 1,000 ml/min, for example, about 10 ml/min to about 800 ml/min, and for example, about 50 ml/min to about 500 ml/min, but the present disclosure is not limited thereto. Since the spray flow rate of the polishing slurry 150 satisfies the above range, it may be more advantageous to move the slurry onto the polishing surface at an appropriate flow rate so that the voids 15 do not load the active ingredient of the slurry required for polishing, but only the debris that is cut with a conditioner or the like and causes defects to occur may be loaded.

The polishing slurry 150 may contain abrasive particles, and the abrasive particles may have an average particle diameter (D50) of about 10 nm to about 500 nm, for example, about 70 nm to about 300 nm. Since the abrasive particles satisfy such a size, it may be advantageous to contribute to physical or chemical polishing while moving on the polishing surface at an appropriate flow rate without being loaded into the voids 15 under the above-described process conditions. That is, when the polishing slurry 150 contains abrasive particles having a size in the above-mentioned range, is sprayed through the supply nozzle 140 at a flow rate in the above-described range, and the relative rotation speed of the polishing pad 100 and the semiconductor substrate 130 satisfies the above-mentioned range, the function of loading the purpose of the debris of the void 150 may be greatly improved.

The polishing slurry 150 may contain, for example, silica particles or ceria particles as the abrasive particles, but the present disclosure is not limited thereto.

The method for manufacturing the semiconductor device may further comprise a step of processing the first surface 11 using a conditioner 170. The step of processing the first surface 11 through the conditioner 170 may be performed simultaneously with the step of polishing the semiconductor substrate 130.

The conditioner 170 may process the first surface 11 while rotating. The conditioner 170 may have a rotation speed of, for example, about 50 rpm to about 150 rpm, for example, about 50 rpm to about 120 rpm, and for example, about 90 rpm to about 120 rpm.

The conditioner 170 may process the first surface 11 while being pressurized against the first surface 11. The conditioner 170 may have a pressurization load on the first surface 11 of, for example, about 1 lb to about 10 lb, for example, about 3 lb to about 9 lb.

The conditioner 170 may process the first surface 11 while performing a vibrating motion in a path reciprocating from the center of the polishing pad 100 to the end of the polishing pad 100. When it is calculated that the vibrating motion of the conditioner 170 reciprocates from the center of the polishing pad 100 to the end of the polishing pad 100 once, the conditioner 170 may have a vibrating motion speed of about 10 times/minute (min) to about 30 times/minute, for example, about 10 times/minute to about 25 times/minute, and for example, about 15 times/minute to about 25 times/minute.

Since the first surface 11, which is the polishing surface, is polished under the condition that the semiconductor substrate 130 is pressurized against the polishing surface while polishing is performed, the first surface 11 is gradually changed to a state unsuitable for polishing such as lowering of the surface roughness, etc. while the pore structure or the like exposed to the surface is being pressed. In order to prevent this, it is possible to maintain it in a surface state suitable for polishing while cutting the first surface 11 through the conditioner 170 having a surface that can be roughened. At this time, when the cut portions of the first surface 11 are not discharged quickly and become debris to be remained on the polishing surface, it may be a cause of generating defects such as scratches on the surface to be polished of the semiconductor substrate 130. From this point of view, while driving conditions of the conditioner 170, that is, the rotation speed, pressurization conditions, etc. are satisfying the above ranges, and at the same time, the polishing pad 100 includes the voids 15 and the openings 16 of the voids, and the opening 16 of the void has features of a width of about more than 0.00 μm, or a value of Equation 1 above of about more than 0.00 and about 15.00 or less so that it may be more advantageous in effectively preventing the occurrence of defects by loading the debris derived from conditioning into the voids 15.

The method for manufacturing the semiconductor device may further comprise a step of detecting a polishing endpoint of the surface to be polished of the semiconductor substrate 130 by allowing light emitted from the light source 180 to reciprocatingly transmit the window 30. Referring to FIGS. 1 and 8, when the second through-hole 201 is connected to the first through-hole 101, a light-path in which light emitted from the light source 180 passes through the entire thickness from the uppermost end surface to the lowermost end surface of the polishing pad 100 may be secured, and an optical endpoint detection method through the window 102 may be applied.

Hereinafter, specific Examples of the present disclosure are presented. However, Examples described below are only for specifically illustrating or explaining the present disclosure, and thus the scope of the present disclosure is not interpreted to be limited, and the scope of the present disclosure is determined by the claims.

PREPARATION EXAMPLE

Preparation Example 1: Preparation of Polishing Layer Composition 72 parts by weight of 2,4-TDI, 18 parts by weight of 2,6-TDI, and 10 parts by weight of $H_{12}MDI$ were mixed based on 100 parts by weight of the total diisocyanate component. 90 parts by weight of PTMG and 10 parts by weight of DEG were mixed based on 100 parts by weight of the total polyol component. A mixed raw material was prepared by mixing 148 parts by weight of the polyol component based on 100 parts by weight of the total diisocyanate component. The mixed raw material was injected into a four-neck flask and reacted at 80° C. to prepare a polishing layer composition comprising a urethane-based prepolymer and having an isocyanate group content (NCO %) of 9.3% by weight.

Preparation Example 2: Preparation of Window Composition 64 parts by weight of 2,4-TDI, 16 parts by weight of 2,6-TDI, and 20 parts by weight of $H_{12}MDI$ were mixed based on 100 parts by weight of the total diisocyanate component. 47 parts by weight of PTMG, 47 parts by weight of PPG, and 6 parts by weight of DEG were mixed based on 100 parts by weight of the total polyol component. A mixed raw material was prepared by mixing 180 parts by weight of the polyol component based on 100 parts by weight of the total diisocyanate component. The mixed raw material was injected into a four-neck flask and reacted at 80° C. to prepare a window composition comprising a urethane-based prepolymer and having an isocyanate group content (NCO %) of 8% by weight.

EXAMPLES AND COMPARATIVE EXAMPLE

Example 1

1.0 parts by weight of a solid-phase foaming agent (Noryon) was mixed with respect to 100 parts by weight of the polishing layer composition of the Preparation Example 1 above, and 4,4'-methylenebis(2-chloroaniline) (MOCA) was mixed as a curing agent such that the molar ratio of the amine group (—$NH_2$) of MOCA to the isocyanate group (—NCO) of 1.0 in the polishing layer composition was 0.95. The polishing layer composition was injected into a mold having a width of 1,000 mm, a length of 1,000 mm, and a height of 3 mm, which had been preheated to 90° C., so that it was injected at a discharge rate of 10 kg/min, and at the same time nitrogen ($N_2$) gas as a gas-phase foaming agent was injected at an injection rate of 1.0 L/min. Subsequently, the preliminary composition was subjected to a post-curing reaction under a temperature condition of 110° C. to prepare a polishing layer. The polishing layer was subjected to turning to a thickness of 2.03 mm, and grooves with a concentric circular structure having a depth of 460 μm, a width of 0.85 mm, and a pitch of 3.0 mm were machined on the polishing surface.

4,4'-methylenebis(2-chloroaniline) (MOCA) was mixed as a curing agent with respect to 100 parts by weight of the window composition of Preparation Example 2 above such that the molar ratio of the amine group (—$NH_2$) of MOCA to the isocyanate group (—NCO) of 1.0 in the polishing layer composition was 0.95. The window composition was injected into a mold having a width of 1,000 mm, a length of 1,000 mm, and a height of 3 mm, which had been preheated to 90° C., so that it was injected at a discharge rate of 10 kg/min, and was subjected to a post-curing reaction under a temperature condition of 110° C. to manufacture a window. The window was processed and manufactured so that the width, length, and thickness of the uppermost end surface and the lowermost end surface thereof respectively satisfy Table 1 below. The window was manufactured so that the respective dimensions of the window satisfied Table 1 below during the manufacturing process of the window, or when these were not satisfied, the window was processed to satisfy them.

A support layer having a structure in which a urethane-based resin is impregnated in a nonwoven fabric including polyester resin fibers and having a thickness of 1.4 mm was prepared.

A first through-hole was formed in a rectangular parallelepiped shape to penetrate from the first surface, which is the polishing surface of the polishing layer, to the second surface, which is the rear surface thereof, so that the width and length of the first through-hole were 20 mm and 60 mm respectively.

Subsequently, after disposing an adhesive film containing a heat-sealing adhesive on one surface of the support layer, and reciprocally laminating them together so as to be in contact with the second surface of the polishing layer, application was performed using a pressure roller, and thermal fusion was performed at 140° C. using a pressure roller to attach the support layer and the polishing layer to each other. Subsequently, cutting processing was performed from the lowermost end surface of the support layer to form a second through-hole penetrating the support layer in the thickness direction, the second through-hole was manufactured to be connected to the first through-hole each other by forming the second through-hole in a region corresponding to the first through-hole, and the second through-hole was formed in a rectangular parallelepiped shape so that the second through-hole had a width of 52 mm and a length of 14 mm respectively.

Then, the window was disposed in the first through-hole so that the window was supported by one surface of the support layer corresponding to a vertical distance between the side surface of the first through-hole and the side surface of the second through-hole.

The window was pressurized against the support surface of the support layer so that a height difference between the uppermost end surface of the window and the first surface was 100 μm, thereby manufacturing a final polishing pad.

Examples 2 to 6

Each polishing pad was manufactured in the same manner as in Example 1 above except that the window was processed and manufactured so that the width and length of the uppermost end surface and lowermost end surface of the window respectively satisfy Table 1 below.

Comparative Example 1

Each polishing pad was manufactured in the same manner as in Example 1 above except that the window was processed and manufactured so that the width and length of the uppermost end surface and lowermost end surface of the window respectively satisfy Table 1 below.

Figure 9:
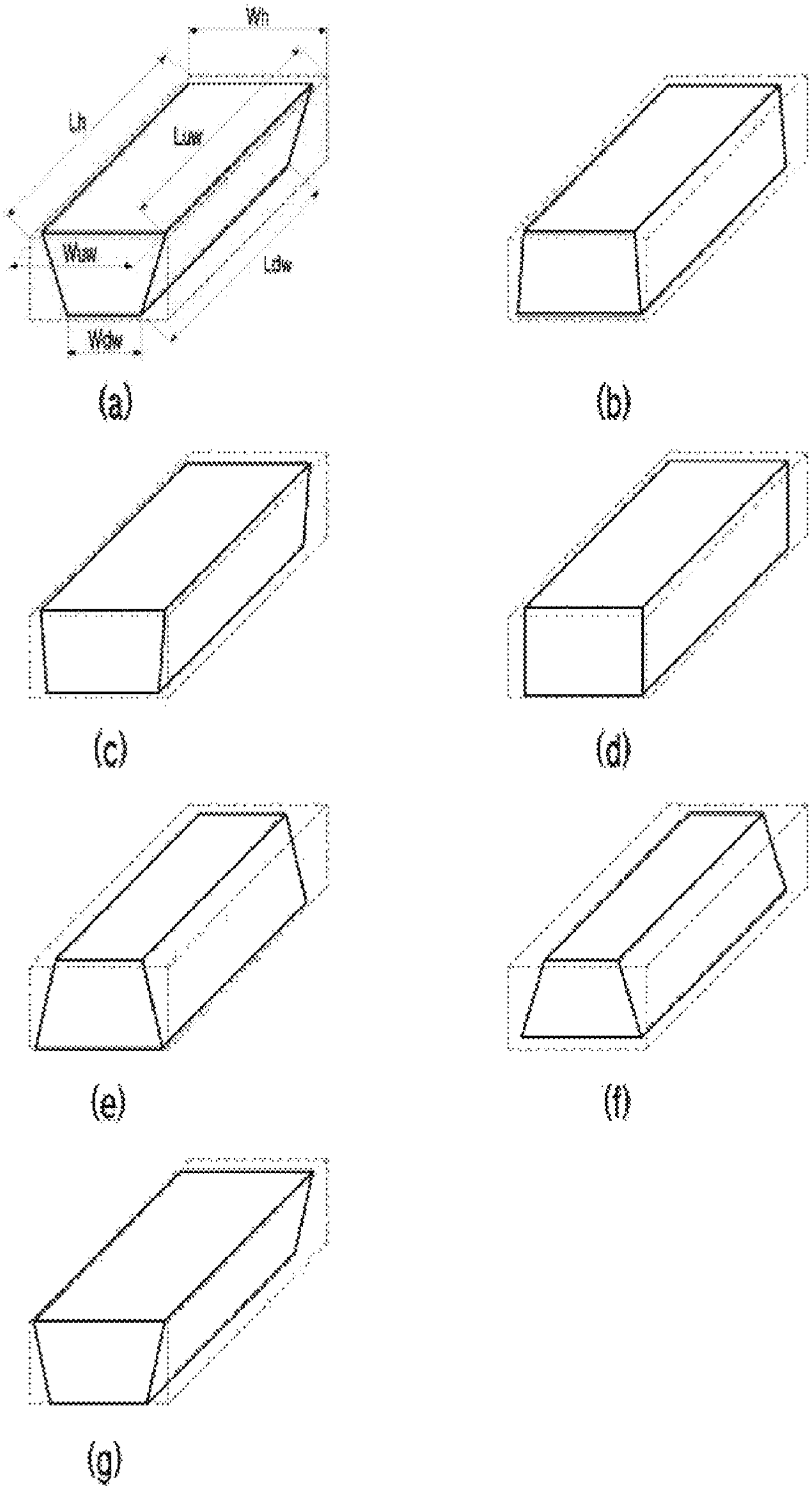
FIG. 9(*a*)-(*g*) is a perspective view schematically illustrating the window shapes of the respective Examples and Comparative Examples.

FIGS. 9(*a*) to 9(*f*) are perspective views schematically illustrating the shape of each window (portion shown in solid line) compared to the size of the first through-hole (portion shown in dotted line) with respect to Examples 1 to 6 above respectively, and FIG. 9(*g*) is a perspective view schematically illustrating the shape of each window (portion shown in solid line) compared to the size of the first through-hole (portion shown in dotted line) with respect to Comparative Example 1 above. Referring to FIG. 9(*a*)-(*g*), the width (Wh) and length (Lh) of the first through-hole of each of Examples and Comparative Example are the same as 20 mm and 60 mm respectively, and an upper end surface width (Wuw), an upper end surface length (Luw), a lower end surface width (Wdw), and a lower end surface length (Ldw) of the window were manufactured as shown in Table 1 below. The width of the opening is an average value, and the value was calculated as ½ of a value obtained by subtracting the upper end surface width (Wuw) of the window from the width (Wh) 20 mm of the first through-hole; or ½ of a value obtained by subtracting the upper end surface length (Luw) of the window from the length (Lh) 60 mm of the first through-hole, and the value is as shown in Table 1 below. The upper end surface area of the window was calculated by the multiplication of the upper end surface width (Wuw) and the upper end surface length (Luw), and the lower end surface area of the window was calculated by the multiplication of the lower end surface width (Wdw) and the lower end surface length (Ldw), and the values are as shown in Table 1 below respectively. The ratio of the lower end surface area to the upper end surface area of the window was calculated using the window area value and is shown in Table 1 below.

TABLE 1

| | Window dimensions [mm] | | | | | Window area [$mm^2$] | | | |
|---|---|---|---|---|---|---|---|---|---|
| Classification | Wuw | Luw | Wdw | Ldw | Thickness | Upper end surface | Lower end surface | Window area ratio (bottom/top) | Opening width [μm] |
| Example 1 | 19.5 | 59.5 | 19.4 | 59.4 | 2.03 | 1160.25 | 1152.36 | 0.993 | 250 |
| Example 2 | 19.49 | 59.49 | 19.5 | 59.5 | 2.03 | 1159.46 | 1160.25 | 1.001 | 255 |
| Example 3 | 19.5 | 59.5 | 19.49 | 59.49 | 2.03 | 1160.25 | 1159.46 | 0.999 | 250 |
| Example 4 | 19.5 | 59.5 | 19.5 | 59.5 | 2.03 | 1160.25 | 1160.25 | 1.000 | 250 |

TABLE 1-continued

| | Window dimensions [mm] | | | | | Window area [mm²] Upper end | Lower end | Window area ratio | Opening width |
|---|---|---|---|---|---|---|---|---|---|
| Classification | Wuw | Luw | Wdw | Ldw | Thickness | surface | surface | (bottom/top) | [μm] |
| Example 5 | 19.5 | 59.5 | 20 | 60 | 2.03 | 1160.25 | 1200.00 | 1.034 | 250 |
| Example 6 | 19.4 | 59.4 | 19.5 | 59.5 | 2_03 | 1152.36 | 1160.25 | 1.007 | 300 |
| Comparative Example 1 | 20 | 60 | 19.5 | 59.5 | 2.03 | 1200 | 1160.25 | 0.967 | 0 |

Evaluation and Measurement

Measurement Example 1: Calculation of Value of Equation 1

The volume of the first through-hole was calculated by the multiplication of the width (Wh), length (Lh), and thickness of the first through-hole, and is shown in Table 2 below. After measuring the width and length of a surface having a relatively wide area out of the upper and lower surfaces of the window and measuring the width and length of a surface having a relatively narrow area, the thickness of the window was measured to calculate an expected height of a pyramid whose base is a surface having a relatively wide area out of the upper and lower surfaces of the window and derive a volume (first volume) of the pyramid. Subsequently, a volume (second volume) of a pyramid whose base is a surface having a relatively narrow area out of the upper and lower surfaces of the window was calculated and subtracted from the first volume to calculate the volume of the window, and the results are as shown in Table 3 below. A volume ratio value (D) of the window to the volume 1.00 of the first through-hole was calculated for each of Examples and Comparative Example using this volume value, and is shown in Table 2 below. The values of Equation 1 below were calculated using the width [μm] values (W) of the openings in Table 1 above and the volume ratio values (D) of the window in Table 2 below, and the values are shown in Table 2 below.

$$W\times(1-D) \quad \text{[Equation 1]}$$

Measurement Example 2: Evaluation of Loading Efficiency of Debris in Voids

After polishing substrates having a silicon oxide film as a surface to be polished using the polishing pads of Examples 1 to 6 and Comparative Example 1 above so that polishing was performed for 1 hour while performing conditioning under pressurized conditions of a 3 lb load using a conditioner (CI45, Saesol Diamond), and then disassembling the window portion and washing the debris loaded in the voids with DI-water to store the washed debris, the weights of the remaining solid materials were measured by vaporizing all the liquid of the washed debris to derive the loading amounts in the voids, and the results are shown in Table 2 below.

Measurement Example 3: Defect Evaluation

After polishing substrates having a silicon oxide film as a surface to be polished using the polishing pads of Examples 1 to 6 and Comparative Example 1 above so that polishing was performed for 60 seconds while performing conditioning under pressurized conditions of a 6 lb load using a conditioner (CI45, Saesol Diamond), the substrates as a polishing target were moved to a cleaner and cleaned for 10 seconds each using 1% HF and deionized water (DIW), 1% $H_2NO_3$, or deionized water (DIW). Thereafter, the substrates were moved to a spin dryer, cleaned with deionized water (DIW), and then dried with nitrogen for 15 seconds. With respect to the surfaces of the dried substrates, the numbers of defects such as scratches on the surfaces were measured using measuring equipment (manufacturer: Tenkor, model name: XP+) and shown in Table 2 below.

TABLE 2

| Classification | Volume [mm³] First through hole | Window | D | Equation 1 | Loading amount [mg] | Defects (ea) |
|---|---|---|---|---|---|---|
| Example 1 | 2400 | 2312 | 0.963 | 9.25 | 0.5 | 250 |
| Example 2 | 2400 | 2319 | 0.966 | 8.67 | 0.6 | 184 |
| Example 3 | 2400 | 2319 | 0.966 | 8.50 | 0.6 | 152 |
| Example 4 | 2400 | 2321 | 0.967 | 8.25 | 0.6 | 144 |
| Example 5 | 2400 | 2340 | 0.975 | 6.25 | 0.8 | 156 |
| Example 6 | 2400 | 2312 | 0.963 | 11.10 | 1.0 | 150 |
| Comparative Example 1 | 2400 | 2340 | 0.975 | 0 | 0.1 | 450 |

Referring to Tables 1 and 2 above, in the polishing pads of Examples 1 to 6 above, the width (μm) of the opening of each void is more than 0.00, and it can be confirmed that the loading amount in the void satisfies about more than 0.1 mg and about 1.00 mg or less. Meanwhile, in the polishing pads of Examples 1 to 6 above, the value of Equation 1 above calculated by the width (μm) value (W) of the opening of each void and the volume ratio value (D) of the window to the first through-hole volume 1.00 satisfies more than 0.00 and 15.00 or less, and it can be confirmed that the loading amount in the void satisfies about more than 0.1 mg and about 1.00 mg or less. When the loading amount in the void falls within the above range, the polishing layer portion cut under a polishing process such as conditioning may be effectively loaded into the void as a debris, thereby obtaining an effect of removing the cause of the occurrence of defects.

Contrary to this, the polishing pad of Comparative Example 1 had a width (μm) of the opening of the void of 0.00, and since the window and the polishing layer were not formed integrally, the debris was partially loaded by movements due to the shear force of the polishing process, but the debris loading ability was significantly lowered as compared to Examples 1 to 6 above. As a result, it could be confirmed that the defect prevention effect was remarkably lowered compared to Examples 1 to 6 above as the defect occurrence was exhibited to be about 1.5 times or more.

EXPLANATION OF REFERENCE NUMERALS

100, 200, 300, 100': Polishing pad
10: Polishing layer

11: Polishing surface, first surface
12: Second surface
13: First through-hole
14: Second through-hole
15: Void
16: Opening of the void
20: Support layer
21: Third surface
22: Fourth surface
30: Window
40: First adhesive layer
50: Second adhesive layer
111: Groove
112: Pore
113: Fine concave portion.

What is claimed is:

1. A polishing pad including:

a polishing layer including a first surface that is a polishing surface and a second surface that is a rear surface thereof, and containing a first through-hole penetrating from the first surface to the second surface;

a window disposed in the first through-hole; and a void between a side surface of the first through-hole and a side surface of the window, wherein an opening of the void is contained between the first surface and an uppermost end surface of the window, wherein the void has a volume gradient that increases in a direction from the first surface to the second surface, wherein a ratio of an area of a lowermost end surface of the window to an area of an uppermost end surface of the window is 0.950 or more and less than 1.000, wherein the opening of the void has a width of 50 μm to less than 300 μm, wherein a unitless volume ratio value calculated by dividing the volume of the window by the volume of the first through-hole is 0.900 to 0.999, wherein an angle formed between the side surface of the first through-hole and the side surface of the window is more than 0° and 20° or less, wherein a value of the following Equation 1 is 5.00 μm to 9.00 μm:

$$W\times(1-D), \quad \text{[Equation 1]}$$

in Equation 1, W is the width in micrometer (μm) of the opening of the void, and D is the unitless volume ratio value calculated by dividing the volume of the window by the volume of the first through-hole in the polishing layer.

2. The polishing pad of claim 1, wherein the loading amount in the void is more than 0.1 mg and 1.00 mg or less.

3. The polishing pad of claim 1, wherein the first surface includes at least one groove, and the groove has a depth of 100 μm to 1,500 μm and a width of 0.1 mm to 20 mm.

4. The polishing pad of claim 3, wherein the first surface includes a plurality of grooves, the plurality of grooves include concentric circular grooves, and a distance between adjacent two grooves of the concentric circular grooves is 2 mm to 70 mm.

5. The polishing pad of claim 1, wherein a Shore D hardness of the first surface of the polishing layer is less than or equal to a Shore D hardness of the uppermost end surface of the window.

6. The polishing pad of claim 1, wherein a Shore D hardness of the uppermost end surface of the window is 50 to 75.

7. The polishing pad of claim 1, wherein a Shore D wet hardness measured at 30° C. of the first surface of the polishing layer is less than a Shore D wet hardness measured at 30° C. of the uppermost end surface of the window.

8. The polishing pad of claim 7, wherein the difference between the Shore D wet hardness values measured at 30° C. of the first surface of the polishing layer and the uppermost end surface of the window is more than 0 and 15 or less.

9. The polishing pad of claim 1, wherein a Shore D wet hardness measured at 50° C. of the first surface of the polishing layer is less than a Shore D wet hardness measured at 50° C. of the uppermost end surface of the window.

10. The polishing pad of claim 9, wherein the difference between the Shore D wet hardness values measured at 50° C. of the first surface of the polishing layer and the uppermost end surface of the window is more than 0 and 15 or less.

11. The polishing pad of claim 1, wherein a Shore D wet hardness measured at 70° C. of the first surface of the polishing layer is less than a Shore D wet hardness measured at 70° C. of the uppermost end surface of the window.

12. The polishing pad of claim 11, wherein the difference between the Shore D wet hardness values measured at 70° C. of the first surface of the polishing layer and the uppermost end surface of the window is more than 0 and 15 or less.

13. The polishing pad of claim 1, wherein the window includes a non-foamed cured product of a window composition comprising a first urethane-based prepolymer.

14. The polishing pad of claim 1, further including a support layer which is disposed on the second surface side of the polishing layer and contains a second through-hole connected to the first through-hole, wherein the support layer includes a third surface of the polishing layer side and a fourth surface that is a rear surface thereof, the second through-hole is smaller than the first through-hole, and the window is supported by the third surface.

15. A method for manufacturing a semiconductor device, the method comprising steps of:

providing a polishing pad including a polishing layer including a first surface that is a polishing surface and a second surface that is a rear surface thereof, containing a first through-hole penetrating from the first surface to the second surface, and including a window disposed in the first through-hole; and polishing the polishing target while rotating the polishing pad and the polishing target relative to each other under pressurized conditions after disposing the polishing target on the first surface so that a surface to be polished of a polishing target and the first surface are in contact with each other, wherein the polishing target includes a semiconductor substrate, the polishing pad includes a void between a side surface of the first through-hole and a side surface of the window, an opening of the void is contained between the first surface and an uppermost end surface of the window, wherein the void has a volume gradient that increases in a direction from the first surface to the second surface, wherein a ratio of an area of a lowermost end surface of the window to an area of the uppermost end surface of the window is 0.950 or more and less than 1.000, wherein the opening of the void has a width of 50 μm to less than 300 μm, wherein a unitless volume ratio value calculated by dividing the volume of the window by the volume of the first through-hole is 0.900 to 0.999, wherein an angle formed between the side surface of the first through-hole and the side surface of the window is more than 0° and 20° or less, wherein a value of the following Equation 1 is 5.00 μm to 9.00 μm:

$$W\times(1-D), \quad \text{[Equation 1]}$$

in Equation 1, W is the width in micrometers (μm) of the opening of the void, and D is the unitless volume ratio value calculated by dividing the volume of the window by the volume of the first through-hole in the polishing layer.

* * * * *